United States Patent
Takashima et al.

(10) Patent No.: US 9,905,433 B2
(45) Date of Patent: Feb. 27, 2018

(54) MANUFACTURING METHOD OF SEMICONDUCTOR DEVICE INCLUDING A NITRIDE SEMICONDUCTOR LAYER

(71) Applicant: FUJI ELECTRIC CO., LTD., Kanagawa (JP)

(72) Inventors: Shinya Takashima, Hachioji (JP); Katsunori Ueno, Matsumoto (JP); Masaharu Edo, Tokorozawa (JP); Akira Uedono, Tsukuba (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/609,035

(22) Filed: May 31, 2017

(65) Prior Publication Data
US 2018/0005843 A1    Jan. 4, 2018

(30) Foreign Application Priority Data
Jul. 4, 2016    (JP) ................ 2016-132832

(51) Int. Cl.
*H01L 21/265*    (2006.01)
*H01L 21/324*    (2006.01)
(Continued)

(52) U.S. Cl.
CPC .... *H01L 21/3245* (2013.01); *H01L 21/26546* (2013.01); *H01L 29/2003* (2013.01); *H01L 29/66522* (2013.01)

(58) Field of Classification Search
CPC ......... H01L 21/26546; H01L 21/26553; H01L 21/324; H01L 29/2003; H01L 29/66522
See application file for complete search history.

(56) References Cited

U.S. PATENT DOCUMENTS

2010/0048005 A1*  2/2010  Seebauer .......... H01L 21/26513
                                                                 438/530

FOREIGN PATENT DOCUMENTS

JP    2540791 B2     7/1993
JP    H08-186332 A   7/1996

OTHER PUBLICATIONS

X.A.Cao et al., "Ultarhigh Si+ implant activation efficiency in GaN using a high-temperature rapid thermal process system", Applied physics Letters, Jul. 13, 1998, vol. 73, Issue 2, p. 229-231.
(Continued)

*Primary Examiner* — Hoai V Pham

(57) ABSTRACT

An ion implantation results in defects generated in a nitride semiconductor layer. If the nitride semiconductor layer is set at a particular temperature for a predetermined time period after the ion implantation, the defects may probably be clustering. Provided is a manufacturing method of a semiconductor device including a nitride semiconductor layer comprising: implanting impurities in the nitride semiconductor layer; and increasing a temperature of the nitride semiconductor layer from an initial temperature to a target temperature and annealing the nitride semiconductor layer at the target temperature for a predetermined time period; wherein in the annealing, in at least part of temperature regions below a first temperature between the initial temperature and the target temperature, the nitride semiconductor layer is annealed at a temperature increase speed lower than in a temperature region not lower than the first temperature.

14 Claims, 22 Drawing Sheets

(51) Int. Cl.
   *H01L 29/20*   (2006.01)
   *H01L 29/66*   (2006.01)

(56) References Cited

OTHER PUBLICATIONS

J.C.Zolper et al., "Si-Implantation activation annealing of GaN up to 1400° C.", Journal of Electronic Materials, Apr. 1998, vol. 27, Issue 4, pp. 179-184.
Takuya Oikawa et al., "Formation of definite GaN p-n junction by Mg-ion implantation to n-GaN epitaxial layers grown on a high-quality free-standing GaN substrate",Nuclear Institutes and Methods in Physics Research Section B: Beam Interactions with Materials and Atoms, vol. 365, Part A. Dec. 15, 2015, pp. 168-170, Proceedings of the 19th International Conference on Ion Beam Modification of Materials (IBMM 2014).

* cited by examiner

MANUFACTURING METHOD OF SEMICONDUCTOR DEVICE INCLUDING A NITRIDE SEMICONDUCTOR LAYER

The contents of the following Japanese patent application are incorporated herein by reference: NO. 2016-132832 filed in JP on Jul. 4, 2016.

BACKGROUND

Technical Field

The present invention relates to a manufacturing method of a semiconductor device.

Conventionally, it is known annealing a gallium nitride compound semiconductor doped with p-type impurities with a cap layer provided thereon (for example, refer to Patent Document 1 and Patent Document 2). Also, it is reported that if gallium nitride implanted with impurities is provided with a cap layer thereon and annealed at a temperature higher than 1400 degrees C., problems occur in the cap layer (Non-Patent Document 1, page 230, left column, lines 24 to 26; and Non-Patent Document 2, page 182, left column, lines 16 to 20). Further, it is reported that gallium nitride implanted with impurities is provided with a cap layer and annealed under a nitrogen gas environment for one minute at 1230 degrees C. (Non-Patent Document 3).

PRIOR ART DOCUMENT

Patent Documents

Patent Document 1: Japanese Patent No. 2540791
Patent Document 2: Japanese Patent Application Publication No. H8-186332

Non-Patent Documents

Non-Patent Document 1: X. A. Cao et al., "Ultarhigh $Si^+$ implant activation efficiency in GaN using a high-temperature rapid thermal process system", Applied Physics Letters, Jul. 13, 1998, volume 73, Issue 2, page 229-231
Non-Patent Document 2: J. C. Zolper et al., "Si-Implantation activation annealing of GaN up to 1400° C.", Journal of Electronic Materials, April 1998, vol. 27, Issue 4, pp. 179-184
Non-Patent Document 3: Takuya Oikawa et al., "Formation of definite GaN p-n junction by Mg-ion implantation to $n^-$-GaN epitaxial layers grown on a high-quality free-standing GaN substrate", Nuclear Institutes and Methods in Physics Research Section B: Beam Interactions with Materials and Atoms, Volume 365, Part A. 15 Dec. 2015, Pages 168-170, Proceedings of the 19th International Conference on Ion Beam Modification of Materials (IBMM 2014)

An ion implantation results in a defect generated in a nitride semiconductor layer. If the nitride semiconductor layer is set at a particular temperature for a predetermined time period after the ion implantation, the defect may probably be clustering.

SUMMARY

In a first aspect of the present invention, provided is a manufacturing method of a semiconductor device including a nitride semiconductor layer. The manufacturing method of a semiconductor device may include implanting and annealing. In the implanting, the nitride semiconductor layer may be implanted with impurities. In the annealing, a temperature of the nitride semiconductor layer may be increased from an initial temperature to a target temperature and the nitride semiconductor layer may be annealed at the target temperature for a predetermined time period. Also, in the annealing, in at least part of temperature regions below a first temperature, the nitride semiconductor layer may be annealed at a temperature increase speed lower than in a temperature region not lower than the first temperature. The first temperature may be a temperature between the initial temperature and the target temperature.

The annealing may include first annealing and second annealing. In the first annealing, the nitride semiconductor layer may be annealed for a predetermined time period in the at least part of temperature regions below the first temperature. The second annealing may be after the first annealing. In the second annealing, the nitride semiconductor layer may be annealed at the target temperature for a predetermined time period.

In a second aspect of the present invention, provided is a manufacturing method of a semiconductor device including a nitride semiconductor layer. The manufacturing method of a semiconductor device may include implanting and annealing. In the implanting, the nitride semiconductor layer may be implanted with impurities. In the annealing, a temperature of the nitride semiconductor layer may be increased from an initial temperature to a target temperature and the nitride semiconductor layer may be annealed at the target temperature for a predetermined time period. Also, in the annealing, a temperature increase speed of the nitride semiconductor layer in a temperature region not lower than a first temperature and not higher than a second temperature may be higher than the temperature increase speed of the nitride semiconductor layer in a temperature region lower than the first temperature and a temperature region higher than the second temperature. The first temperature may be higher than the initial temperature. The second temperature may be higher than the first temperature and lower than the target temperature.

At the first temperature in the annealing, the temperature increase speed of the nitride semiconductor layer may be set higher than in a temperature region lower than the first temperature. At the second temperature in the annealing, the temperature increase speed of the nitride semiconductor layer may be set lower than in a temperature region not lower than the first temperature and not higher than the second temperature.

The first temperature may be not lower than 500 degrees C. and not higher than 900 degrees C.

The second temperature may be not lower than 700 degrees C. and not higher than 1100 degrees C.

The annealing may include annealing the nitride semiconductor layer at a temperature lower than the first temperature for 10 minutes or more.

The manufacturing method of a semiconductor device may further include forming a protective film on the nitride semiconductor layer. The forming a protective film on the nitride semiconductor layer may be after the implanting and before the annealing.

In the implanting, the impurities may be implanted in the nitride semiconductor layer having a temperature not higher than 150 degrees C.

In the implanting, the impurities may be implanted in the nitride semiconductor layer having a room temperature.

In the nitride semiconductor layer before the annealing, a representative combined defect may be smaller than a combined defect $V_{Ga}(V_N)_2$. The combined defect $V_{Ga}(V_N)_2$ may be formed of one gallium vacancy and two nitrogen vacancies.

The nitride semiconductor layer may be a homoepitaxial layer. The nitride semiconductor layer may be provided on a nitride semiconductor substrate. The nitride semiconductor substrate may have a threading dislocation density of $10^7$ cm$^{-2}$ or less.

The nitride semiconductor layer and the nitride semiconductor substrate may contain gallium nitride.

In the implanting, ion species of the impurities may be one or more types from among magnesium, calcium, beryllium and zinc.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments do not limit the invention according to the scope of claim. Also, all the combinations of the features described in the embodiments are not necessarily essential to means provided by aspects of the invention.

Figure 1:
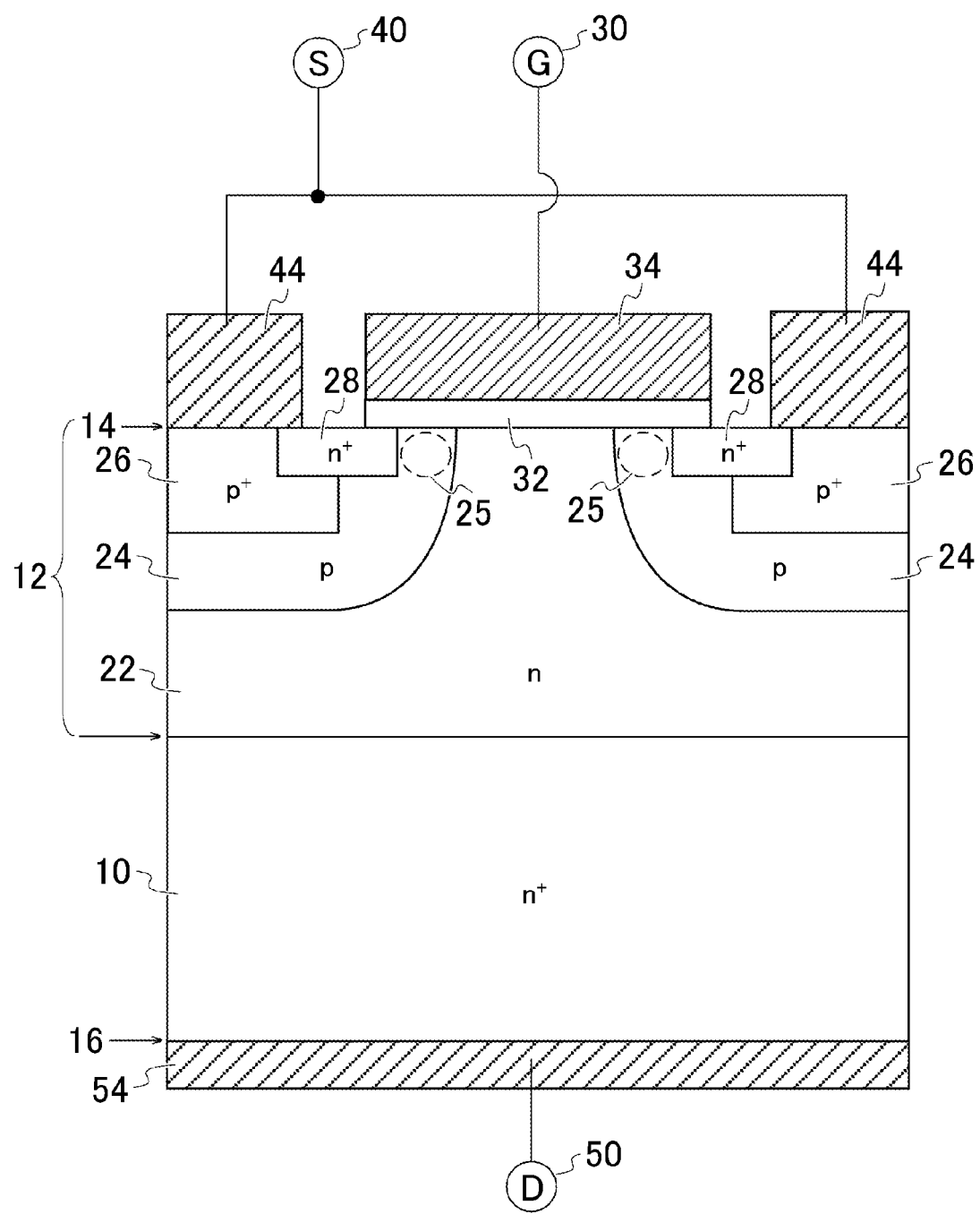
FIG. 1 is a schematic diagram illustrating an MOSFET 100 in the first embodiment.

FIG. 1 is a schematic diagram illustrating an MOSFET 100 in the first embodiment. The MOSFET (Metal Oxide Semiconductor Field Effect Transistor) 100 of the present example is a so-called vertical MOSFET. The MOSFET 100, as a semiconductor device, may have a function to switch between a conductive state and a non-conductive state of currents.

The MOSFET 100 of the present example includes an n$^+$-type GaN substrate 10 as a nitride semiconductor substrate, a GaN layer 12 as a nitride semiconductor layer, a gate insulating film 32, a gate electrode 34, a source electrode 44 and a drain electrode 54.

The GaN layer 12 is provided on the GaN substrate 10 such that it directly contacts the GaN substrate 10. The GaN layer 12 is a homoepitaxial layer provided on the GaN substrate 10. In the present example, a front surface 14 is a main surface of the GaN layer 12 not in contact with the GaN substrate 10. Also, a back surface 16 is a main surface of the GaN substrate 10 not in contact with the GaN layer 12.

In the present example, "on" means a direction from the back surface 16 of the GaN substrate 10 to the front surface 14 of the GaN layer 12. Also, "under" means a direction opposite to the "on". "On" and "under" do not necessarily mean a direction vertical to the ground. "On" and "under" are merely convenient expressions to identify a relationship of relative positions of layers, films and the like.

A region of the GaN layer 12 in which impurities are implanted may be exposed to at least part of the front surface 14. In the present example, the region in which impurities are implanted is a p-type well 24, a p$^+$-type well 26 and an n$^+$-type well 28 which are formed within a range of a predetermined depth from the front surface 14. Note that an n-type means n-type impurities with respect to a nitride semiconductor and a p-type means p-type impurities with respect to a nitride semiconductor.

In the implanting step, ion species of the n-type impurities may be one or more types of elements from among Si (silicon), Ge (germanium), and O (oxygen). In the present example, Si is used as the n-type impurities. Also, in the implanting step, ion species of the p-type impurities may be one or more types of elements from among Mg (magnesium), Ca (calcium), Be (beryllium) and Zn (zinc). In the present example, Mg is used as the p-type impurities.

An n-type region 22 functions as a drift layer of the MOSFET 100. In the p-type well 24, a section immediately under the gate insulating film 32 and between the n-type region 22 and the n$^+$-type well 28 functions as a channel forming region 25. The p$^+$-type well 26 has a function to reduce a contact resistance with the source electrode 44 and a function to provide a route for pulling out holes during an off state. Also, the n$^+$-type well 28 functions as a source region.

The gate insulating film 32 is provided to directly contact at least upper sides of the p-type well 24 and the n-type region 22. The gate electrode 34 is provided on the gate insulating film 32 such that it directly contacts the gate insulating film 32. The source electrode 44 is provided to electrically connect the n+-type well 28 and the p+-type well 26. Also, the drain electrode 54 is provided to directly contact the back surface 16 of the GaN substrate 10.

A gate terminal 30, a source terminal 40 and a drain terminal 50 are shown in circles with G, D and S, respectively. For example, it is assumed that the drain electrode 54 has a predetermined high potential and the source electrode 44 has a ground potential. If a potential not lower than a threshold voltage is given to the gate electrode 34 from the gate terminal 30, an electric charge inverting layer is formed in the channel forming region 25 and currents flow from the drain terminal 50 to the source terminal 40. Also, if a potential lower than the threshold voltage is given to the gate electrode 34, the electric charge inverting layer in the channel forming region 25 disappears and currents are blocked.

Figure 2:
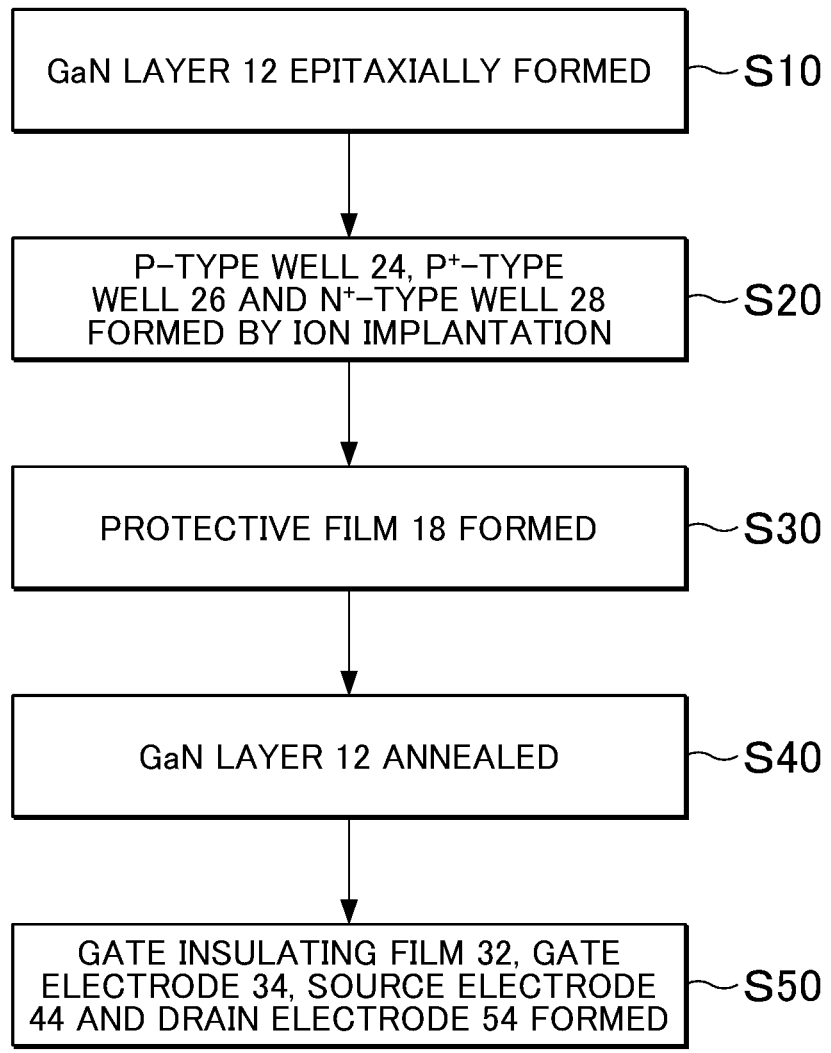
FIG. 2 is a flow diagram illustrating a manufacturing process of the MOSFET 100 in the first embodiment.

FIG. 2 is a flow diagram illustrating a manufacturing process of the MOSFET 100 in the first embodiment. The manufacturing process of the present example is performed in the order from a step S10 to a step S50. The manufacturing process of the present example includes a step of an epitaxial formation of the GaN layer 12 (S10), a step of an ion implantation with impurities in the front surface 14 of the GaN layer 12 (S20), a step of providing a protective film 18 on the front surface 14 of the GaN layer 12 (S30), a step of annealing the GaN layer 12 (S40), and a step of forming the gate insulating film 32 and the like (S50). As described later, in the annealing step (S40) of the present example, clustering of defects in the GaN layer 12 may be suppressed by adjusting a temperature increase speed as appropriate.

Figure 3A:
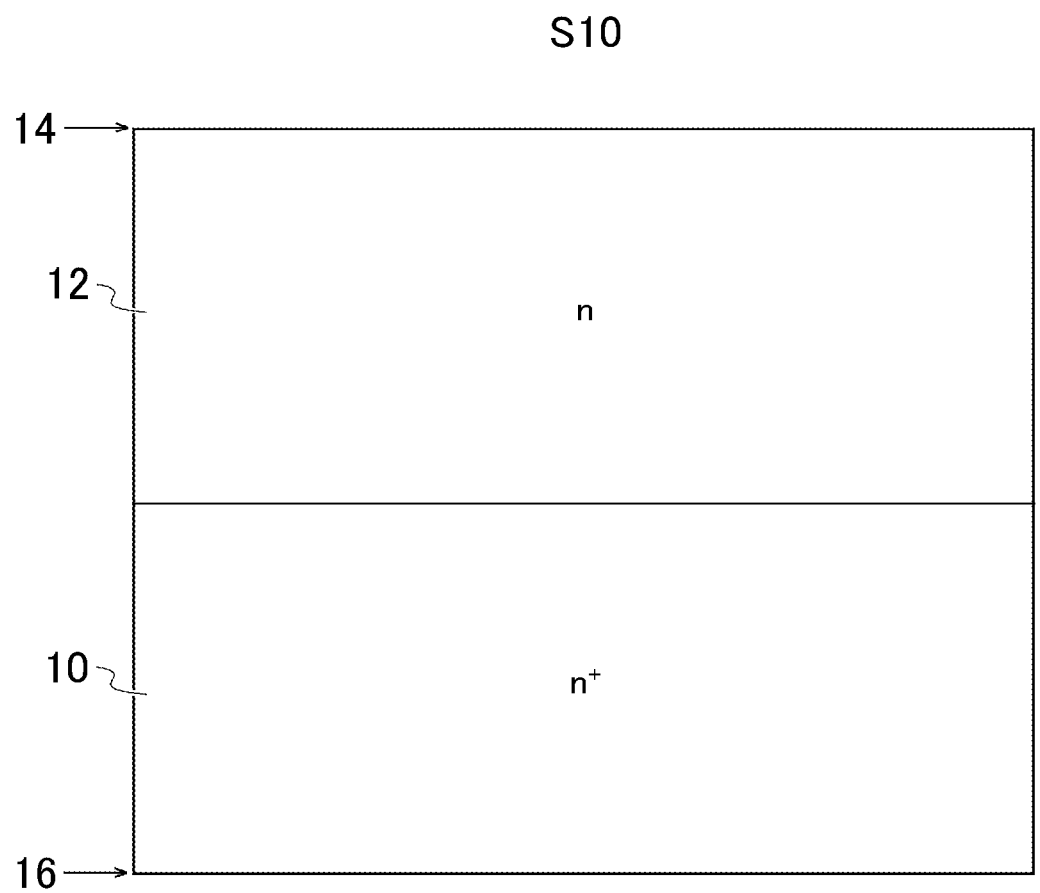
FIG. 3A is a diagram illustrating the step S10 in the manufacturing process.

FIG. 3A is a diagram illustrating the step S10 in the manufacturing process. In the step S10 of the present example, in order to epitaxially form the GaN layer 12 on the GaN substrate 10 by the metalorganic chemical vapor deposition (MOCVD), a raw material gas containing trimethyl gallium (Ga(CH$_3$)$_3$), ammonia (NH$_3$) and monosilane (SiH$_4$), and a pressurizing gas containing nitrogen (N$_2$) and hydrogen (H$_2$) are flown on the GaN substrate 10. Si of monosilane functions as n-type impurities in the GaN layer 12.

The GaN substrate 10 may have a threading dislocation density of $10^7$ cm$^{-2}$ or less. This allows a threading dislocation density in the GaN layer 12 formed thereon to be $10^7$ cm$^{-2}$ or less, thereby effectively providing a defect reduction effect in the GaN layer 12 in the ion implantation step (S20) and the annealing step (S40). That is, if the GaN layer 12 has a threading dislocation density greater than $10^7$ cm$^{-2}$, it is not preferable because threading dislocations reduce the defect reduction effect resulting from control of a substrate temperature in the ion implantation step (S20) and an annealing temperature in the annealing step (S40).

Note that instead of the MOCVD, a halide vapor phase epitaxy (HVPE) or a molecular beam epitaxy (MBE) may also be used as a method of forming the GaN layer 12. It should be understood that the threading dislocation density is desired to be $10^7$ cm$^{-2}$ or less in either case.

Figure 3B:
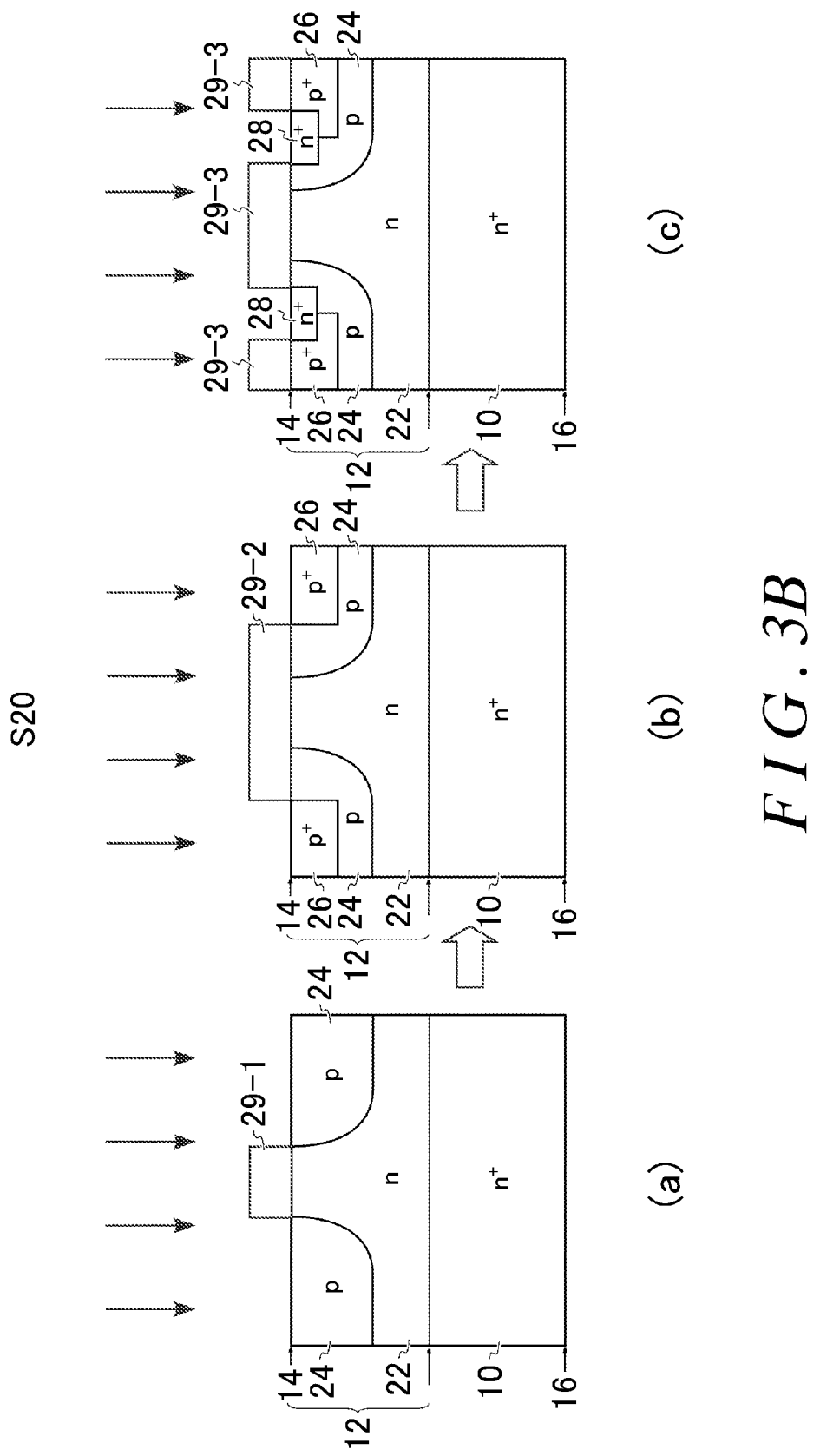
FIGS. 3B (a) to (c) are diagrams illustrating the step S20 in the manufacturing process.

FIGS. 3B (a) to (c) are diagrams illustrating the step S20 in the manufacturing process. In step S20 of the present example, the ion implantation is selectively performed on the n-type region 22 of the GaN layer 12 via a photoresist mask 29. This forms the p-type well 24, the p+-type well 26 and the n+-type well 28.

(a) is a diagram illustrating a step of implanting p-type impurities in the GaN layer 12. In the present example, the ion implantation with Mg is performed on the GaN layer 12 through a multi-stage implantation at accelerating voltages of 20, 40, 70, 110, 150, 200, 250, and 430 keV and with a dosage 6E+12 cm$^{-2}$. This can form the p-type well 24 having an impurity concentration of 1E+17 cm$^{-3}$ after the step S40. Note that E means powers of 10. For example, E+17 means $10^{17}$.

(b) is a diagram illustrating a step of implanting p-type impurities in the GaN layer 12. In the present example, the ion implantation with Mg is performed on the p-type well 24 at the accelerating voltage of 10 keV and with the dosage 4.5E+13 cm$^{-2}$. This can form the p+-type well 26 having an impurity concentration of 2E+19 cm$^{-3}$ after the step S40.

(c) is a diagram illustrating a step of implanting n-type impurities in the GaN layer 12. In the present example, the ion implantation with Si is performed on the p-type well 24 and the p+-type well 26, respectively, through the multi-stage implantation at the accelerating voltages 30, 60, and 80 keV and with the dosage 3E+15 cm$^{-2}$. This can form the n+-type well 28 having an impurity concentration of 1E+20 cm$^{-3}$ after the step S40.

In the step S20 of the present example, impurities are implanted in the GaN layer 12 having a temperature not higher than 150 degrees C. In the present example, in FIGS. 3B (a), (b) and (c), a temperature of the GaN layer 12 is set not higher than 150 degrees C. When the photoresist mask 29 is used for the impurity implantation, it may be assumed that 150 degrees C. is a temperature at which the photoresist mask 29 functions to block impurities from being implanted in the GaN layer 12.

If the temperature of the GaN layer 12 is set not higher than 150 degrees C. during the ion implantation, a size of the defect in the GaN layer 12 after the ion implantation may be reduced, compared to the one at not lower than 500 degrees C. Note that, in the present example, a defect means a vacancy defect (that is, a defect configured by vacancies) generated in the GaN layer 12. Reducing the size of the defect after the ion implantation is advantageous for crystal recovery in the GaN layer 12 in the annealing step. Note that the relationship between the temperature of the GaN layer 12 at the impurity implantation and the size of the generated defect is described later.

In the step S20 of the present example, the ion implantation with impurities is performed on the GaN layer 12 of the room temperature. The room temperature may be not lower than 1 degrees C. and not higher than 30 degrees C., and may be not lower than 15 degrees C. and not higher than 25 degrees C. If the GaN layer 12 is set at the room temperature during the ion implantation, for example, it is also advantageous that a temperature control for the GaN layer 12 is facilitated, compared to the GaN layer 12 set at not higher than 0 degrees C. or at not lower than 50 degrees C.

However, in order to keep the temperature of the GaN layer 12 at a constant temperature, the temperature of the GaN layer 12 may also be a constant temperature not higher than 100 degrees C., not higher than 0 degrees C., or not higher than −50 degrees C. By using a heating unit, the temperature of the GaN layer 12 may be set to be a constant temperature not lower than the room temperature and not higher than 100 degrees C. Also, by using a coolant or cooling element, the temperature of the GaN layer 12 may be set to be a constant temperature not higher than 0 degrees C. or not higher than −50 degrees C.

Figure 3C:
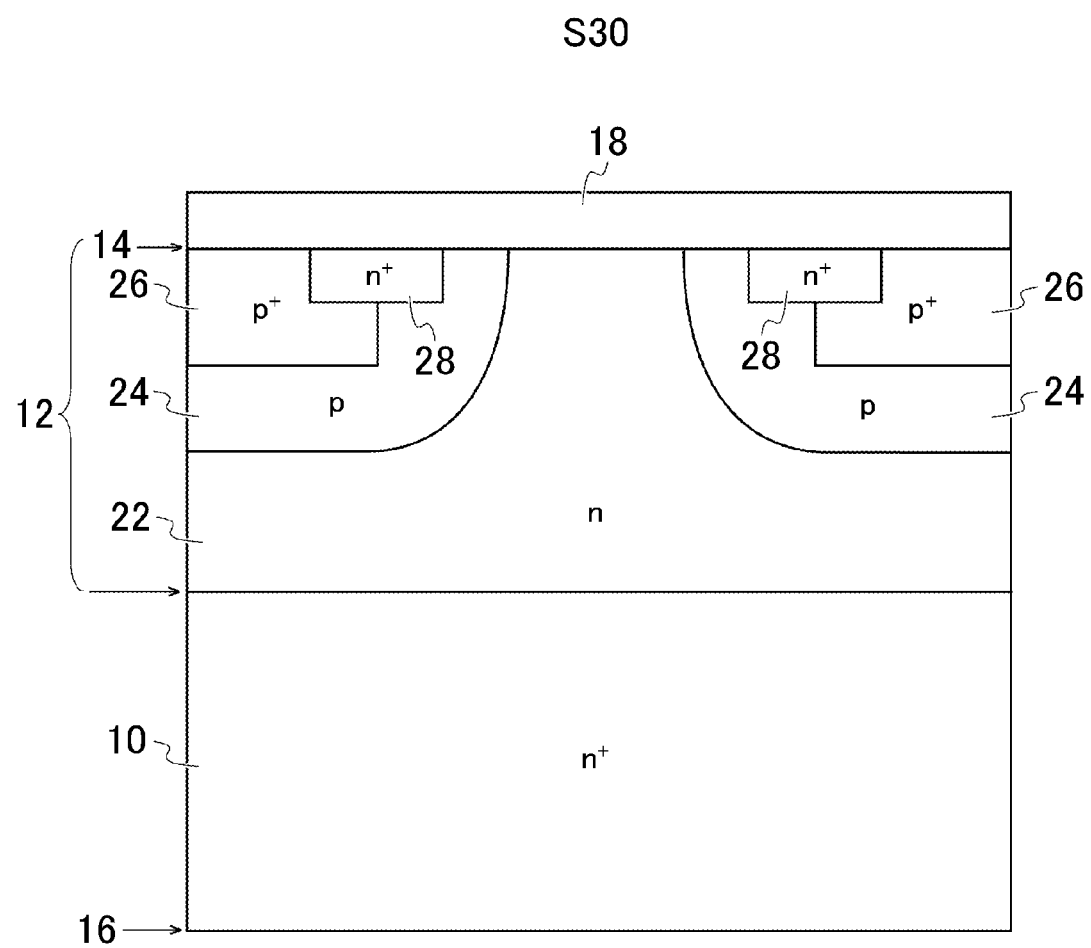
FIG. 3C is a diagram illustrating the step S30 in the manufacturing process.

FIG. 3C is a diagram illustrating the step S30 in the manufacturing process. In the step S30 of the present example, the protective film 18 is formed on the GaN layer 12 such that it directly contacts the GaN substrate 12. This forms a processed stacked structure 60 including the GaN substrate 10, the GaN layer 12 and the protective film 18.

In the present example, an impurity region formed by the ion implantation disturbs a crystal structure of the front surface 14. Therefore, compared to the epitaxially formed impurity region, N (nitrogen atom) is easily released from the GaN layer 12. In the present example, as the protective film 18 is provided, nitrogen atoms released from the GaN layer 12 in the step S40 can be reduced.

In the annealing step, it is desirable that the protective film 18 of the present example has a high heat resistance and a good adhesion to the GaN layer 12, prevents impurities from diffusing from the protective film 18 to the GaN layer 12, and is selectively removable from the GaN layer 12. The high heat resistance of the protective film 18 means that, even if heated at a temperature from 1400 degrees C. to 1500 degrees C., substantial resolution does not occur such that pits (penetrating openings) are not formed in the protective film 18.

The protective film 18 of the present example is an AlN film. The AlN film satisfies all of the conditions described above. Note that the protective film 18 may also be a silicon dioxide ($SiO_2$) film or a silicon nitride (SiN) film. However, in the $SiO_2$ film and the SiN film, it is impossible to completely eliminate the possibility that Si as the n-type impurities is diffused into the GaN layer 12 at the annealing. Therefore, the AlN film is more desirable than the $SiO_2$ film and the SiN film. Note that the protective film 18 may also be a stacked film in which a plurality of layers of the $SiO_2$ film, the SiN film and the GaN film are further stacked on the AlN film which is provided on the GaN layer 12 such that it directly contacts the GaN layer 12. In this case, the AlN film may also function as a diffusion prevention layer for the n-type impurities.

The protective film 18 may be formed by a sputtering method using an AlN target. Note that, in another example, the protective film 18 may also be epitaxially formed by the MOCVD, HVPE, MBE, PLD or the like. Also, the protective film 18 may be formed, through a combination of two or more types of methods from among the sputtering, MOCVD, HVPE, MBE and PLD, by stacking two or more types of films of the different methods.

The protective film 18 may have a thickness of 2 nm or more and 1000 nm or less. The protective film 18 of the present example has a thickness of approximately 200 nm. If the protective film 18 is formed by the sputtering, the thickness may be 100 nm or more and 1000 nm or less. If the protective film 18 is formed by the MOCVD or HVPE, the thickness may be 2 nm or more and 100 nm or less. Also, if the protective film 18 is formed by the MBE or PLD, the thickness may be 10 nm or more and 100 nm or less.

Figure 3D:
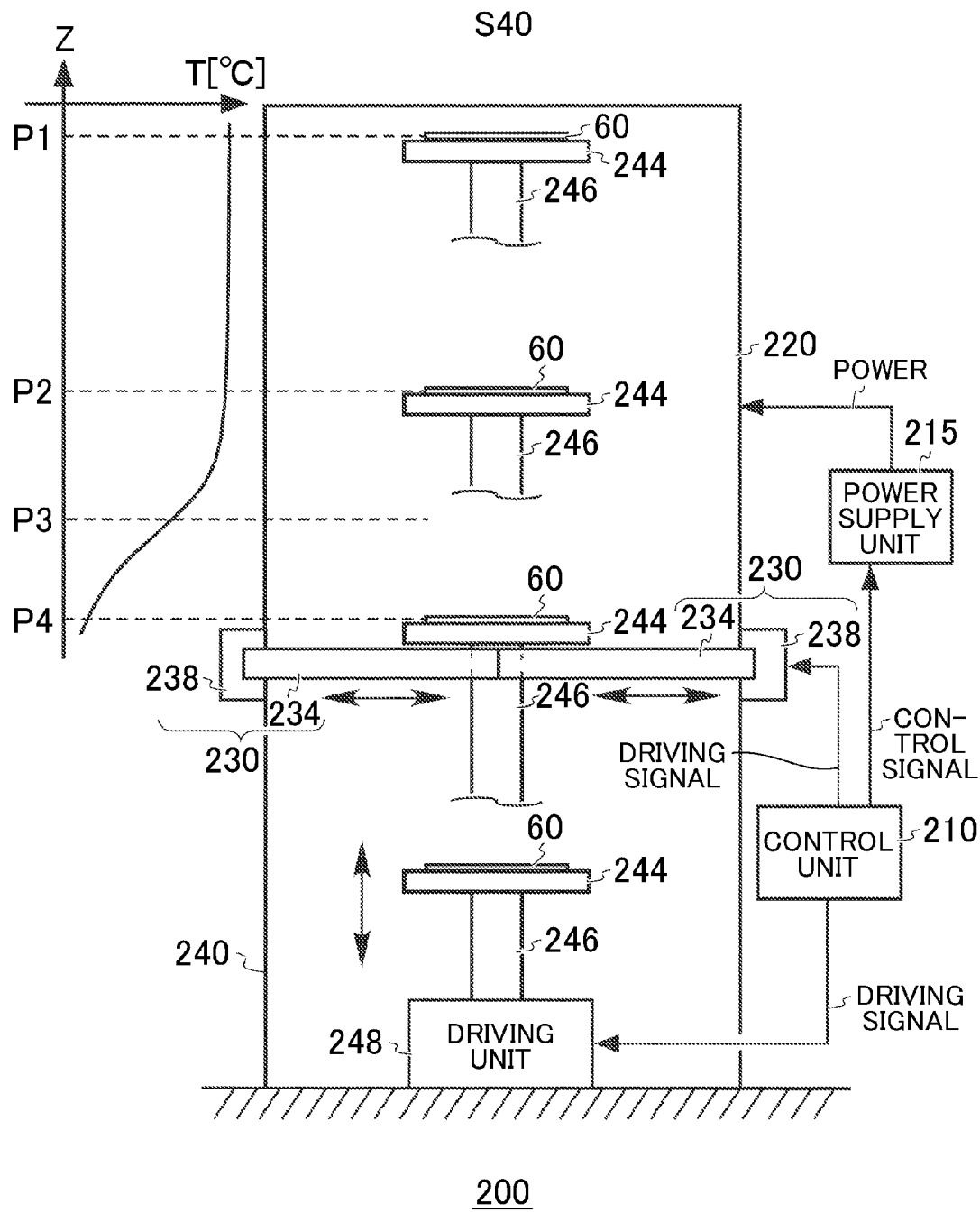
FIG. 3D is a diagram illustrating the step S40 in the manufacturing process.

FIG. 3D is a diagram illustrating the step S40 in the manufacturing process. In the step S40, the processed stacked structure 60 is thermally processed by using an annealing apparatus 200. The thermal process step includes increasing the temperature of the GaN layer 12 from the initial temperature to the target temperature, and annealing the GaN layer 12 at the target temperature for a predetermined time period. The thermal process step may include pre-annealing the GaN layer 12 at a temperature lower than the target temperature.

The annealing apparatus 200 of the present example includes a control unit 210, a power supply unit 215, an annealing furnace 220, a shutter unit 230, and an elevation unit 240. In the present example, a direction parallel to upward and downward directions of the processed stacked structure 60 is defined as a Z direction. The upward direction is defined as a +Z direction and the downward direction is defined as a −Z direction.

The annealing furnace 220 of the present example is an electric annealing furnace. The control unit 210 transmits a control signal to the power supply unit 215 to control a power input to the annealing furnace 220. This allows the control unit 210 to determine the temperature inside the annealing furnace 220. The control unit 210 may keep the input power constant with respect to the time, or may also increase or decrease the input power with respect to the time.

The annealing furnace 220 may have a predetermined temperature distribution in the Z direction. If the power is input to the annealing furnace 220, the temperature of an inner space of the annealing furnace 220 may become higher toward the +Z direction. Even if the input power is constant or varied with respect to the time, the temperature of the inner space of the annealing furnace 220 may be formed. For convenience of the description, inside the annealing furnace 220, a position in the furthermost +Z direction in which the processed stacked structure 60 can be arranged is defined as P1 and a position in the furthermost −Z direction in which the processed stacked structure 60 can be arranged is defined as P4. Also, between the position P1 and the position P3, a predetermined position relatively in the +Z direction is defined as P2 and a predetermined position relatively in the −Z direction is defined as P3.

In the order of P4, P3, P2 and P1, the temperature inside the annealing furnace 220 may be higher. Between P4 and P2, the temperature may be changed rapidly toward the +Z direction. In contrast, the temperature may be changed gradually between P2 and P1, compared to the change in temperature between P4 and P2. Such a temperature distribution may be formed depending on an arrangement of a heater inside the annealing furnace 220.

The annealing apparatus 200 of the present example controls the annealing temperature of the processed stacked structure 60 depending on the position of the processed stacked structure 60. The control unit 210 sets the position in the Z direction at the position P3 while keeping the input power to the annealing furnace 220 constant, thereby pre-annealing the processed stacked structure 60. Next, while keeping the input power constant and setting the position in the Z direction at the position P2, it anneals the processed stacked structure 60 at the target temperature.

The control unit 210 may control the shutter unit 230 to be opened and closed. The shutter unit 230 includes a shutter 234 and a driving unit 238. The driving unit 238 opens and closes the shutter 234 in response to an instruction from the control unit 210.

The control unit 210 controls an operation of an driving unit 248 of the elevation unit 240. The driving unit 248 moves the stage 246 parallel to the Z direction. This allows a tray 244 and the processed stacked structure 60 to move in the Z direction. The tray 244 is provided at an end of the stage 246 in the +Z direction and the processed stacked structure 60 is placed on the tray 244.

If the shutter 234 is in an open state, the tray 244 may enter into and exit from the annealing furnace 220 in the Z direction. Also, if the shutter 234 is in a closed state, the tray 244 may remain still in the inner space of the annealing furnace 220, or may be moved in the Z direction.

Specific procedures of the annealing step are, for example, as described below. First, the shutter 234 is set in the open state. Then, the tray 244 on which the processed stacked structure 60 is placed is positioned in the inner space of the annealing furnace 220. Then, the shutter 234 is turned to be in the closed state. Then, the processed stacked structure 60 is annealed (pre-annealed and annealed at the target temperature). Then, the shutter 234 is turned to be in the open state and the processed stacked structure 60 and the tray 244 are moved to outside the annealing furnace 220.

In the present example, the processed stacked structure 60 is annealed at the target temperature not lower than 1200 degrees C. and not higher than 1500 degrees C., more preferably, not lower than 1400 degrees C. and not higher than 1500 degrees C. Note that, when annealed, the inner space of the annealing furnace 220 may be filled with a gas containing nitrogen ($N_2$) and ammonia ($NH_3$). In another example, without providing the protective film 18 on the GaN layer 12, the inner space of the annealing furnace 220 may also be filled with the gas.

Figure 3E:
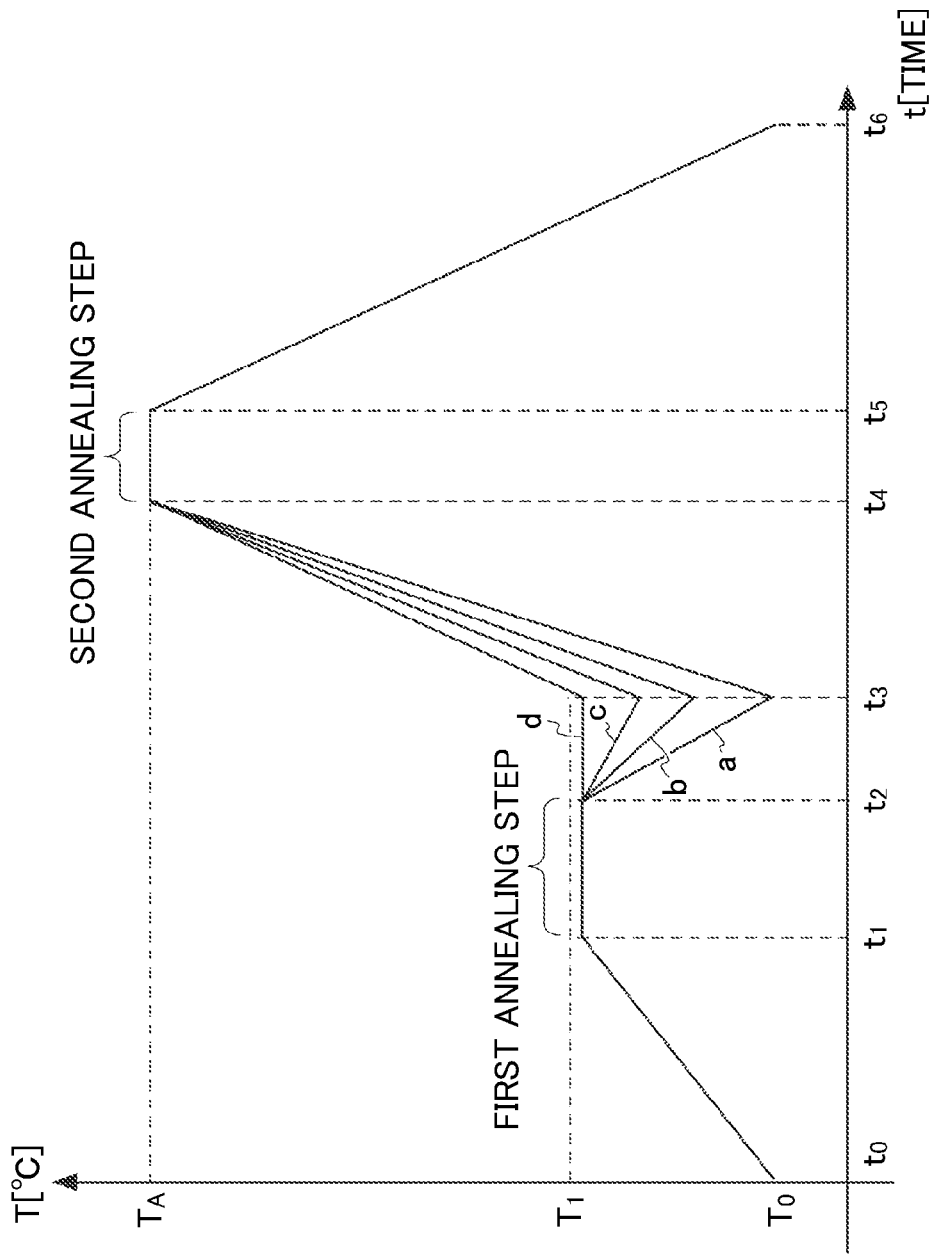
FIG. 3E is a diagram illustrating variations over time of the temperature T of the GaN layer 12 in the step S40.

FIG. 3E is a diagram illustrating variations over time of the temperature T of the GaN layer 12 in the step S40. In the present example, the temperature of the GaN layer 12 is $T_0$ at the time $t_0$. The temperature $T_0$ is an initial temperature of the GaN layer 12. The initial temperature is a temperature of the GaN layer 12 in a not heated state. The initial temperature is, for example, the room temperature.

The temperature of the GaN layer 12 is increased from the time $t_0$ to the time $t_1$. In the present example, after the power is input to the annealing furnace 220, the position of the processed stacked structure 60 in the Z direction is gradually elevated from the position P4. Note that the elevation speed of the processed stacked structure 60 may be constant per unit time. In this manner, the temperature increase speed of the GaN layer 12 may be kept constant. In the present example, the temperature increase speed means an elevation of the temperature of the GaN layer 12 per unit time. The temperature of the GaN layer 12 is increased until it reaches a temperature lower than the temperature $T_1$ which corresponds to the first temperature at the time $t_1$.

The temperature $T_1$ is a temperature between the initial temperature $T_0$ and the target temperature $T_A$. The temperature $T_1$ may be not lower than 500 degrees C. and not higher than 900 degrees C. In the present example, the temperature $T_1$ is not lower than 700 degrees C. and not higher than 900 degrees C. Note that the target temperature $T_A$ is the highest temperature among the temperatures of the GaN layer 12 that are maintained for certain time periods in order to anneal the GaN layer 12 in the step S40. The target temperature $T_A$ is a substantial annealing temperature for the purpose of crystal recovery and activation of impurities in the GaN layer 12.

In the step S40, in at least part of temperature regions below the temperature $T_1$, the GaN layer 12 is annealed at a temperature increase speed lower than in a temperature region not lower than the temperature $T_1$. At least part of temperature regions below the temperature $T_1$ mean a part of temperature regions from the time $t_0$ to the time $t_3$. Note that a temperature increase speed being low means an elevation in temperature per unit time being small. The temperature increase speed being low is also to include the case in which the temperature is maintained at a constant temperature.

In the present example, for a predetermined time period from the time $t_1$ to the time $t_2$, the temperature of the GaN layer 12 may be kept constant at a temperature lower than the temperature $T_1$ (pre-annealing temperature). In the present example, the position of the processed stacked structure 60 is fixed at P3 so that the temperature of the GaN layer 12 is kept constant. A period from the time $t_1$ to the time $t_2$ may be 10 minutes or more, and may also be 20 minutes or more or 30 minutes or more.

In the present example, the temperature of the GaN layer 12 is kept constant at 600 degrees C. for 20 minutes. This allows the GaN layer 12 to be pre-annealed (first annealing step). Pre-annealing the GaN layer 12 at a temperature lower than the target temperature $T_A$ prevents the front surface 14 of the GaN layer 12 from being rough. This can make an interface between the channel forming region 25 and the gate insulating film 32 of the MOSFET 100 flatter than the one without being pre-annealed, thereby reducing an undesired level of the interface.

The temperature of the GaN layer 12 may be decreased from the time $t_2$ to the time $t_3$. In the present example, the temperature decrease speed of the GaN layer 12 is kept constant by moving the stage 246 downward at a constant speed. The temperature of the GaN layer 12 may be decreased until it reaches a temperature lower than the pre-annealing temperature at the time $t_3$. It may be determined as appropriate what temperature the temperature of the GaN layer 12 is decreased to.

A path a is an example of decreasing the temperature to the initial temperature $T_0$ at the time $t_3$. In the order of paths b, c and d, the temperature of the GaN layer 12 is higher at the time $t_3$. Note that the path d indicates an example of maintaining the pre-annealing temperature until the time $t_3$. In the path d, pre-annealing may be performed from the time $t_1$ to the time $t_3$. Note that, in the paths a, b and c, the temperature increase speeds in a temperature region lower than the temperature $T_1$ may be the same as the temperature increase speeds in a temperature region not lower than the temperature $T_1$.

The temperature of the GaN layer 12 is increased again from the time $t_3$ to the time $t_4$. In the present example, the stage 246 is elevated at a constant speed higher than the temperature increase speed from the time $t_0$ to the time $t_1$. This makes the temperature increase speed of the GaN layer 12 from the time $t_3$ to the time $t_4$ higher than the temperature increase speed of the GaN layer 12 from the time $t_0$ to the time $t_1$.

If the GaN layer 12 is set at a temperature of, for example, not lower than 700 degrees C. and not higher than 900 degrees C. for a predetermined time period after the ion implantation, the defect in the GaN layer 12 may probably be clustering (refer to the description of FIG. 13 described later). It is difficult to annihilate the defect once clustered, even if it is annealed at the target temperature $T_A$.

Therefore, in the present example, the temperature increase speed in a temperature region not lower than the temperature $T_1$ and lower than the target temperature $T_A$ (for example, not lower than 700 degrees C. and not higher than 900 degrees C.) is set higher than the temperature increase speed in a temperature region lower than the temperature $T_1$. The predetermined time period for which the GaN layer 12 is at not lower than 700 degrees C. and not higher than 900 degrees C. may be 20 minutes or less, more preferably, 10 minutes or less, and still preferably, one minute or less. Also, the temperature increase speed of the GaN layer 12 in the temperature region may be 20 degrees C./sec. This can suppress clustering of the defect in the GaN layer 12.

In the present example, the GaN layer 12 is set at the target temperature $T_A$ at the time $t_4$. Then, the GaN layer 12 is annealed at the target temperature $T_A$ for a predetermined time period (second annealing). The target temperature $T_A$ may be not lower than 1100 degrees C. and not higher than 1500 degrees C. The target temperature $T_A$ of the present example is 1300 degrees C. The GaN layer 12 is annealed by keeping the temperature of the GaN layer 12 at the target temperature $T_A$ from the time $t_4$ to the time $t_5$. In the present example, a period from the time $t_4$ to the time $t_5$ is five minutes. This allows the defect formed during the ion implantation to be recovered and the implanted impurities to be activated. Preferably, the target temperature $T_A$ is not lower than 1300 degrees C. and not higher than 1500 degrees C. in particular, in terms of the defect recovery and activation of the implanted impurities.

The temperature starts to be decreased at the time $t_5$. Note that the power may not be input to the annealing furnace 220 during the temperature decrease. When the temperature is decreased to $T_0$ at the time $t_6$, the processed stacked structure 60 is taken out of the annealing furnace 220.

In the present example, as shown in FIG. 3D, adjusting the position of the processed stacked structure 60 in the Z direction results in changes in temperature of the GaN layer 12. However, in another example, by varying the power input to the annealing furnace 220 without moving the stage 246, the temperature in the annealing furnace 220 and the temperature of the GaN layer 12 may be changed. That is, while maintaining the position of the processed stacked structure 60 at P2, the temperature of the GaN layer 12 may be increased by increasing the input power or the temperature of the GaN layer 12 may be decreased by decreasing the input power. In this manner, the changes in temperature of the GaN layer 12 may be the same as in FIG. 3E.

Figure 3F:
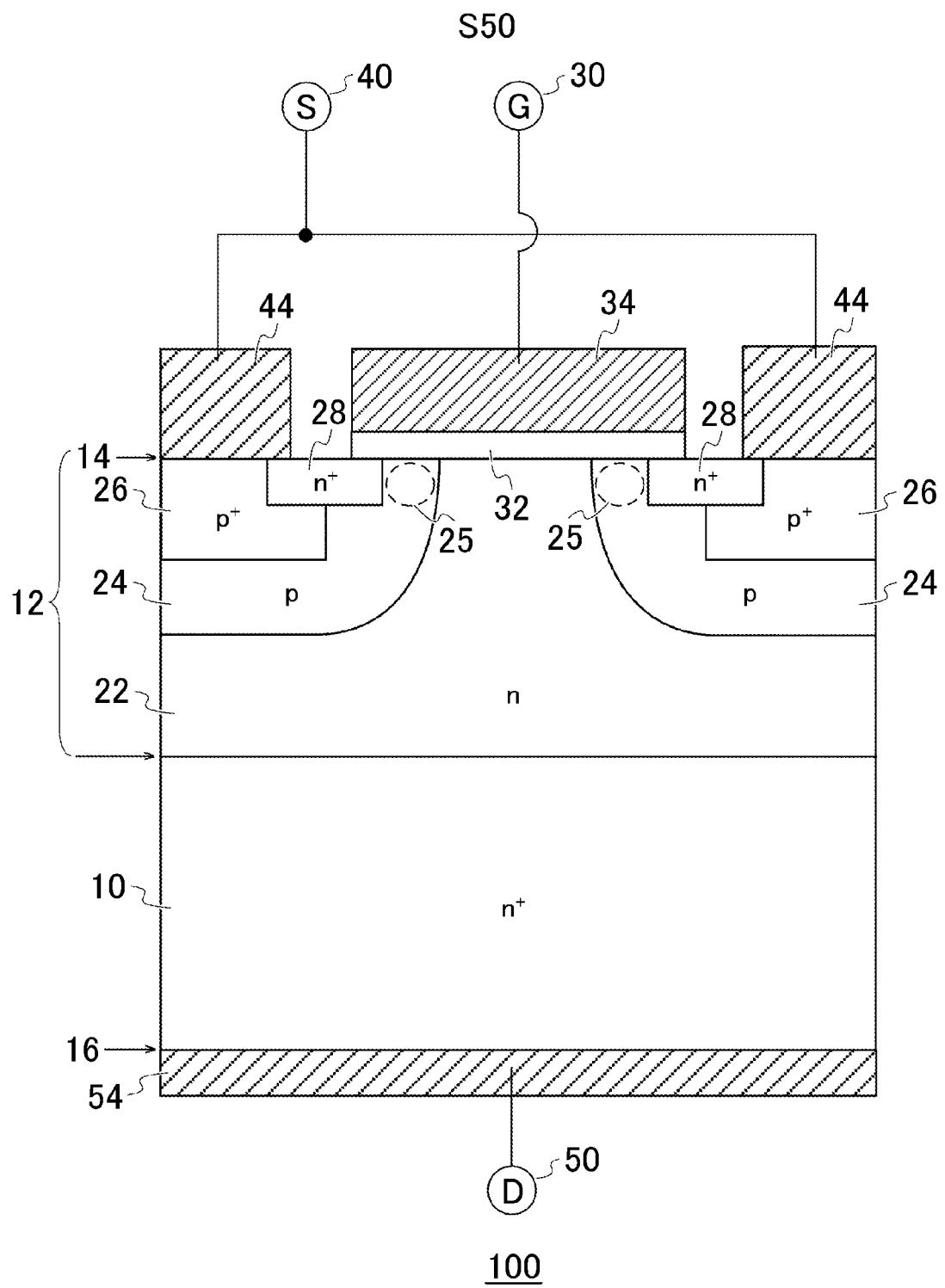
FIG. 3F is a diagram illustrating the step S50 in the manufacturing process.

FIG. 3F is a diagram illustrating the step S50 in the manufacturing process. In the step S50, a known film formation method and a patterning method are applied so that the gate insulating film 32, the gate electrode 34, the source electrode 44 and the drain electrode 54 are formed, respectively. In the present example, an $SiO_2$ film as the gate insulating film 32 is formed by the low pressure chemical vapor deposition (LPCVD). The gate insulating film 32 has a thickness of 100 nm, for example. Note that, instead of the $SiO_2$ film, the gate insulating film 32 may also be a silicon oxynitride (SiON) film, an aluminum oxide ($Al_2O_3$) film, a magnesium oxide (MgO) film, a gallium oxide ($GaO_x$) film and a gadolinium oxide ($GdO_x$) film and a stacked film including two or more types thereof.

Then, a polycrystalline silicon as the gate electrode 34 is formed by the LPCVD. During film formation or after film formation of the polycrystalline silicon, one or more types of elements of phosphorus (P) and arsenic (As) may be doped in a polycrystalline silicon. This can provide the polycrystalline silicon with an improved conductivity. Note that the gate electrode 34 may be a metal film of any of gold (Au), platinum (Pt) and nickel (Ni), or may also be a film of an alloy thereof. The gate insulating film 32 and the gate electrode 34 are patterned by photolithography and etching.

Then, the source electrode 44 is formed. The source electrode 44 may be a stacked structure including a Ti (titanium) layer as a lower layer and an Al layer as an upper layer. Note that, in order to reduce a contact resistance between the source electrode 44 and the $p^+$-type well 26, the $p^+$-type well 26 may contain Ni (nickel), Pd (palladium) or Pt (platinum) at an interface with the source electrode 44. Then, the drain electrode 54 is formed. The drain electrode 54 may be a stacked structure including a Ti layer as an upper layer which directly contacts the back surface 16 of the GaN substrate 10 and an Al layer as a lower layer.

Then, the gate terminal 30, the source terminal 40 and the drain terminal 50 are connected to the gate electrode 34, the source electrode 44 and the drain electrode 54 via wirings, respectively. This results in the MOSFET 100.

Figure 4:
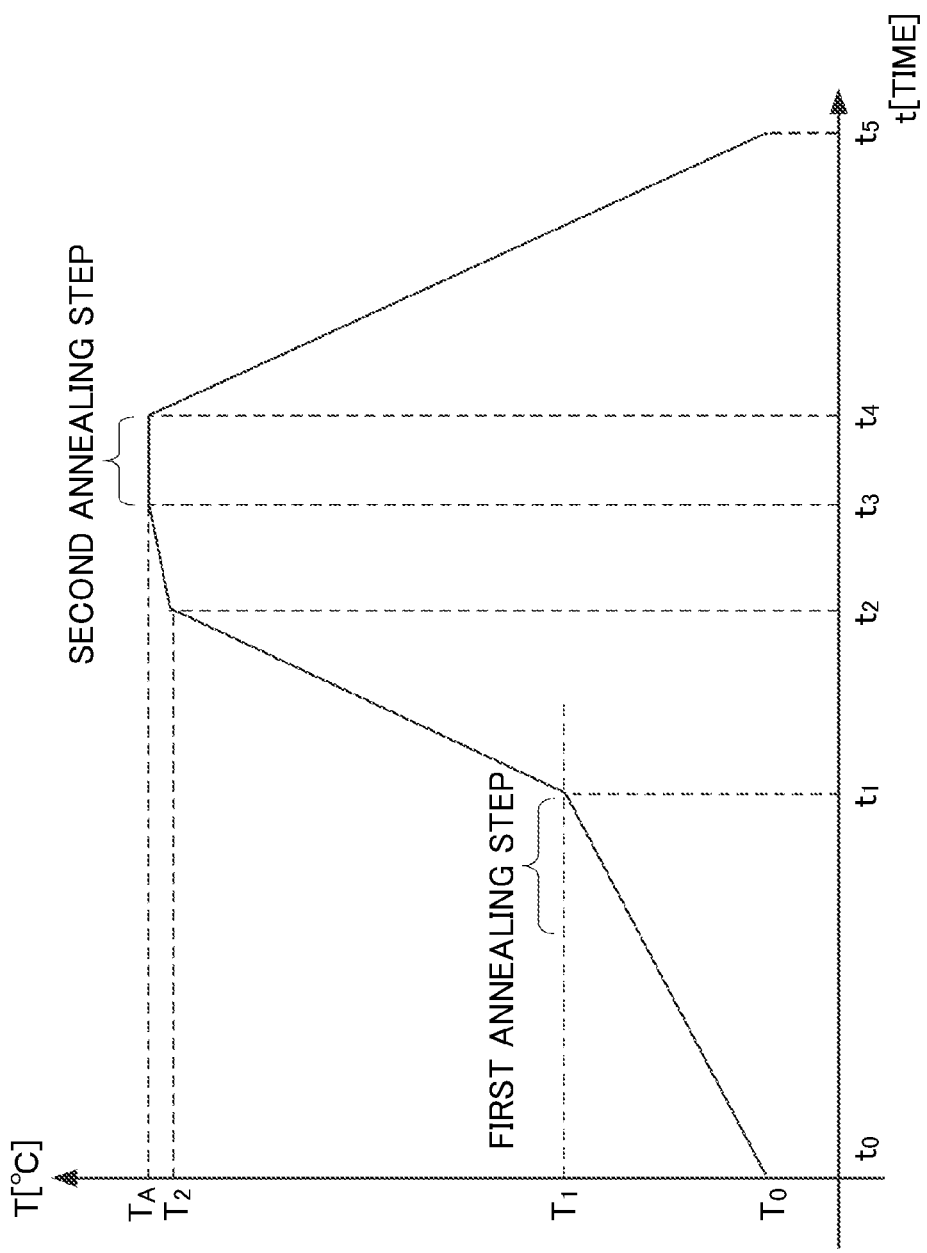
FIG. 4 is a diagram illustrating variations over time of the temperature T of the GaN layer 12 in the step S40 in the second embodiment.

FIG. 4 is a diagram illustrating variations over time of the temperature T of the GaN layer 12 in the step S40 in the second embodiment. In the present example, until the second annealing is completed, the temperature of the GaN layer 12 is kept increased continuously without being decreased, or kept constant. In the present example, the temperature increase speed of the GaN layer 12 in a temperature region not lower than the temperature $T_1$ and not higher than the temperature $T_2$ is higher than the temperature increase speed of the GaN layer 12 in a temperature region lower than the temperature $T_1$ and a temperature region higher than the temperature $T_2$.

In the present example, the temperature of the GaN layer 12 is the temperature $T_0$ at the time $t_0$. Then, the temperature of the GaN layer 12 is increased until reaching the temperature $T_1$ at the time $t_1$. The temperature $T_1$ is a temperature higher than the initial temperature $T_0$ which is the same as in the first embodiment. Note that, similar to the first embodiment, the position of the processed stacked structure 60 in the Z direction may be elevated so that the temperature of the GaN layer 12 is increased, or the input power to the annealing furnace 220 may be increased so that the temperature of the GaN layer 12 is increased.

Similar to the first embodiment, the GaN layer 12 may be pre-annealed (first annealing) from the time $t_0$ to the time $t_1$. In the present example, the GaN layer 12 may be pre-annealed in a process of gradually increasing the temperature from the temperature $T_0$ to the temperature $T_1$. The pre-annealing time period (from the time $t_0$ to the time $t_1$) may be 10 minutes or more. However, as a time period for maintaining at the temperature $T_1$ is shorter than in the first embodiment, the pre-annealing time period of the present example may be longer than in the first embodiment. This can prevent the front surface 14 of the GaN layer 12 from being rough.

Then, at the time $t_1$ (at the temperature $T_1$), the temperature increase speed of the GaN layer 12 is increased to be higher than in a temperature region lower than the temperature $T_1$. Further, the temperature of the GaN layer 12 is then rapidly increased until reaching the temperature $T_2$ which corresponds to the second temperature at the time $t_2$. The temperature $T_2$ is a temperature higher than the temperature $T_1$ and lower than the target temperature $T_A$. The temperature $T_2$ may be not lower than 700 degrees C. and not higher than 1100 degrees C. The temperature $T_2$ of the present example is not lower than 900 degrees C. and not higher than 1100 degrees C.

A period from the time $t_1$ to the time $t_2$ may be 20 minutes or less, more preferably, 10 minutes or less, and still preferably, one minute or less. Also, the temperature increase speed of the GaN layer 12 in the temperature region may be 20 degrees C./sec. This can shorten a predetermined time period for which the GaN layer 12 is not lower than 700 degrees C. and not higher than 900 degrees C., similar to the first embodiment, thereby suppressing clustering of the defect in the GaN layer 12.

Then, at the time $t_2$ (at the temperature $T_2$), the temperature increase speed of the GaN layer 12 is decreased again to be lower than in a temperature region not lower than the temperature $T_1$ and not higher than the temperature $T_2$. The temperature of the GaN layer 12 is gradually increased to the target temperature $T_A$ until the time $t_3$. Then, between the time $t_3$ and the time $t_4$, the GaN layer 12 is annealed at the target temperature $T_A$ for a predetermined time period (second annealing). The target temperature $T_A$ may be the same as in the first embodiment. In the present example, a period from the time $t_3$ to the time $t_4$ is five minutes. This allows the defect formed during the ion implantation to be recovered and the implanted impurities to be activated.

Next, the temperature starts to be decreased at the time $t_4$. If the temperature is decreased to $T_0$ by the time $t_5$, the processed stacked structure 60 is taken out of the annealing furnace 220. The temperature adjustment method in this step is similar to the process for decreasing the temperature in the first embodiment.

Figure 5:
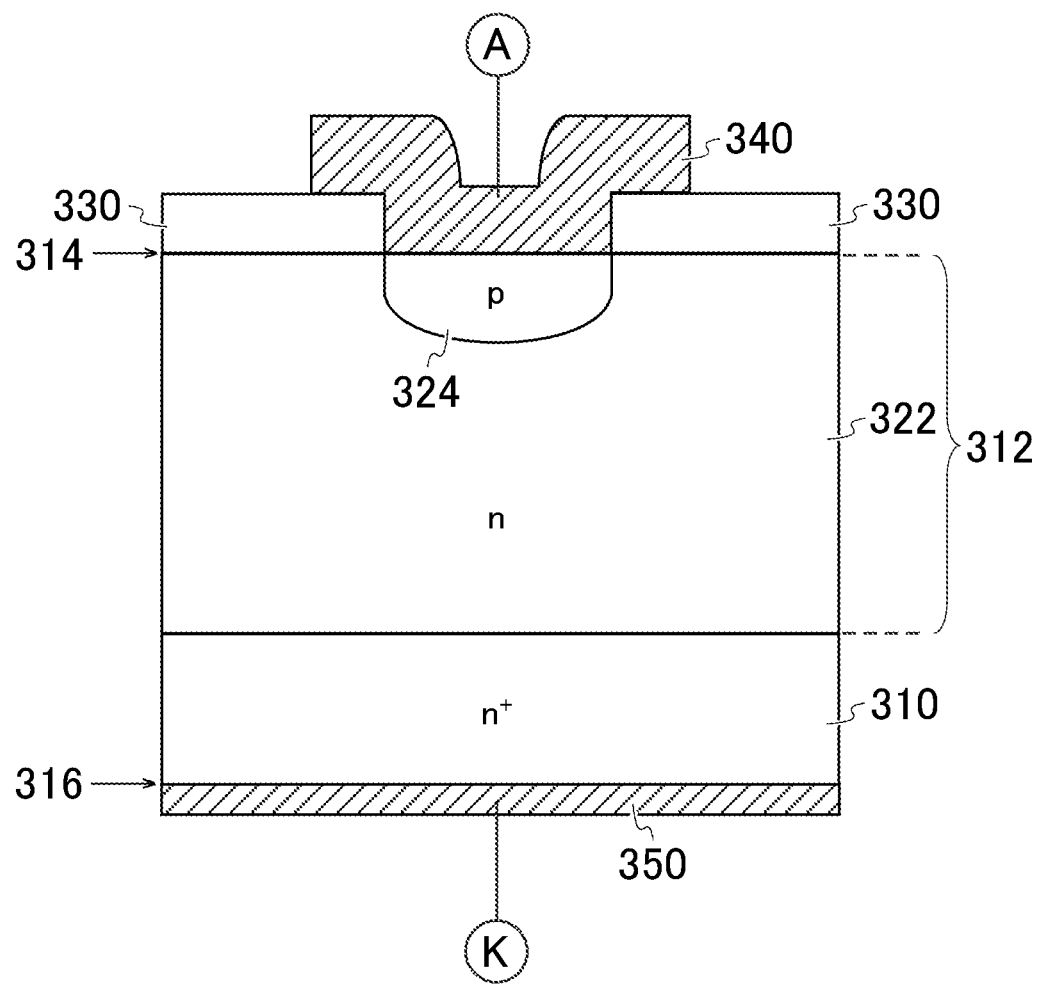
FIG. 5 is a schematic diagram illustrating a diode 300 in the third embodiment.

FIG. 5 is a schematic diagram illustrating a diode 300 in the third embodiment. The diode 300 as a semiconductor device includes an $n^+$-type GaN substrate 310, a GaN layer 312 as a nitride semiconductor layer, an insulating film 330, an anode electrode 340 and a cathode electrode 350. The insulating film 330 is provided to contact a front surface 314 of the GaN layer 312. The insulating film 330 of the present example includes an opening. The anode electrode 340 is provided on the GaN layer 312 such that it reaches the front surface 314 through the opening. The cathode electrode 350 is provided to directly contact a back surface 316 of the GaN substrate 310.

The GaN layer 312 includes an n-type region 322 and a p-type well 324. The p-type well 324 of the present example is provided to be exposed to the front surface 314. The anode electrode 340 electrically connects to the p-type well 324.

The p-type well 324 may be formed through the impurity implantation step in FIG. 3B (a), the forming step of the protective film 18 in FIG. 3C, and the annealing step in FIG. 3C and FIG. 3D. Also, the temperature control in the second embodiment may be applied to the annealing step. This results in an effect of pre-annealing, an effect of suppressing clustering of the defect, an effect of recovery of the defect generated during the ion implantation, and an effect of activating the implanted impurities.

Figure 6:
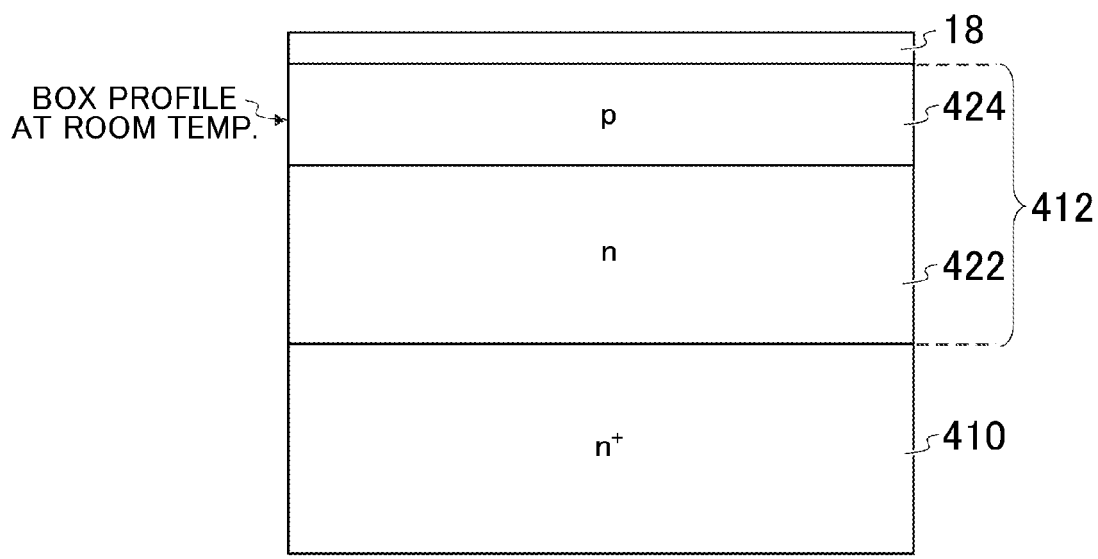
FIG. 6 is a schematic diagram illustrating a processed stacked structure 460 in the experimental example 1.

FIG. 6 is a schematic diagram illustrating a processed stacked structure 460 in the experimental example 1. The processed stacked structure 460 of the present example includes a GaN substrate 410 of an $n^+$-type, a GaN layer 412 on the GaN substrate 410, and a protective film 18 on the GaN layer 412. Note that the GaN layer 412 includes an n-type region 422 and a p-type region 424.

The GaN substrate 410 was formed by the HVPE. The GaN substrate 410 had a dislocation density of $10^6$ cm$^{-3}$. Also, the GaN layer 412 was epitaxially formed by the MOCVD on a (0001) surface of the GaN substrate 410. Note that impurities were not added intentionally during the epitaxial formation. A thickness of the GaN layer 412 was set to 8 μm.

The p-type region 424 of the GaN layer 412 was formed by implanting p-type impurities in the GaN layer 412. Note that the GaN layer 412 was set at the room temperature at the impurity implantation. That is the GaN layer 412 was not heated intentionally at the impurity implantation.

Mg was used as the p-type impurities. Mg ions were implanted in the GaN layer 412 while controlling the accelerating voltage (keV) and the dosage (cm$^{-2}$). Specifically, the dosage was set to 3.0E+13 cm$^{-2}$ at 15 keV, and similarly, 5.5E+13 cm$^{-2}$ at 30 keV, 1.1E+14 cm$^{-2}$ at 55 keV, 1.9E+14 cm$^{-2}$ at 95 keV, and 8.0E+14 cm$^{-2}$ at 180 keV. This formed in the GaN layer 412 the p-type region 424 having a BOX profile of a density of 4E+19 cm$^{-3}$ and a depth of 200 nm. A region other than the p-type region 424 in the GaN layer 412 became the n-type region 422.

Then, a protective film (AlN film) was formed to contact an upper side of the p-type region 424. The AlN film was formed by sputtering. A thickness of the AlN film was set to 300 nm.

Figure 7:
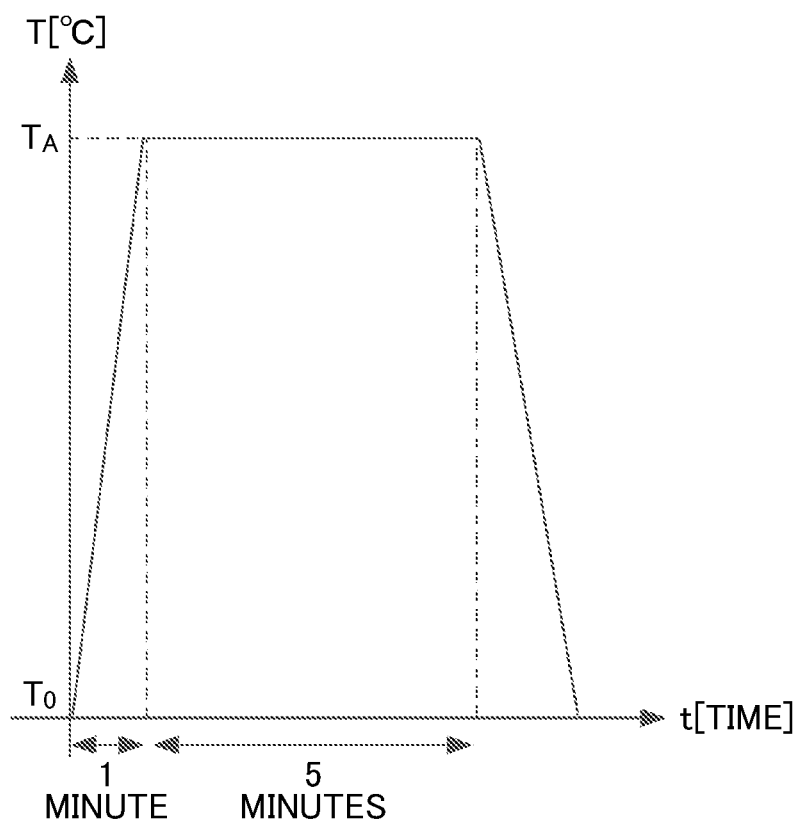
FIG. 7 is a diagram illustrating the annealing step in the experimental example 1.

FIG. 7 is a diagram illustrating the annealing step in the experimental example 1. In the present example, eight processed stacked structures 460 were prepared. The eight processed stacked structures 460 were, after their temperatures were increased from the room temperature to a predetermined temperature of about 20 degrees C./sec, annealed for five minutes at target temperatures $T_A$ altogether in the annealing furnace 220. The target temperatures $T_A$ were set to 300 degrees C., 500 degrees C., 700 degrees C., 900 degrees C., 1000 degrees C., 1100 degrees C., 1200 degrees C. and 1300 degrees C., respectively. Then, a protective film 18 was removed from each processed stacked structure 460 and a defect of each processed stacked structure 460 was analyzed by the positron annihilation method. Also, the GaN layer 412 implanted with impurities but not annealed (indicated as "As implanted") and the GaN layer 412 without implanted with impurities nor annealed (indicated as "Un-implanted") were also prepared.

Figure 8:
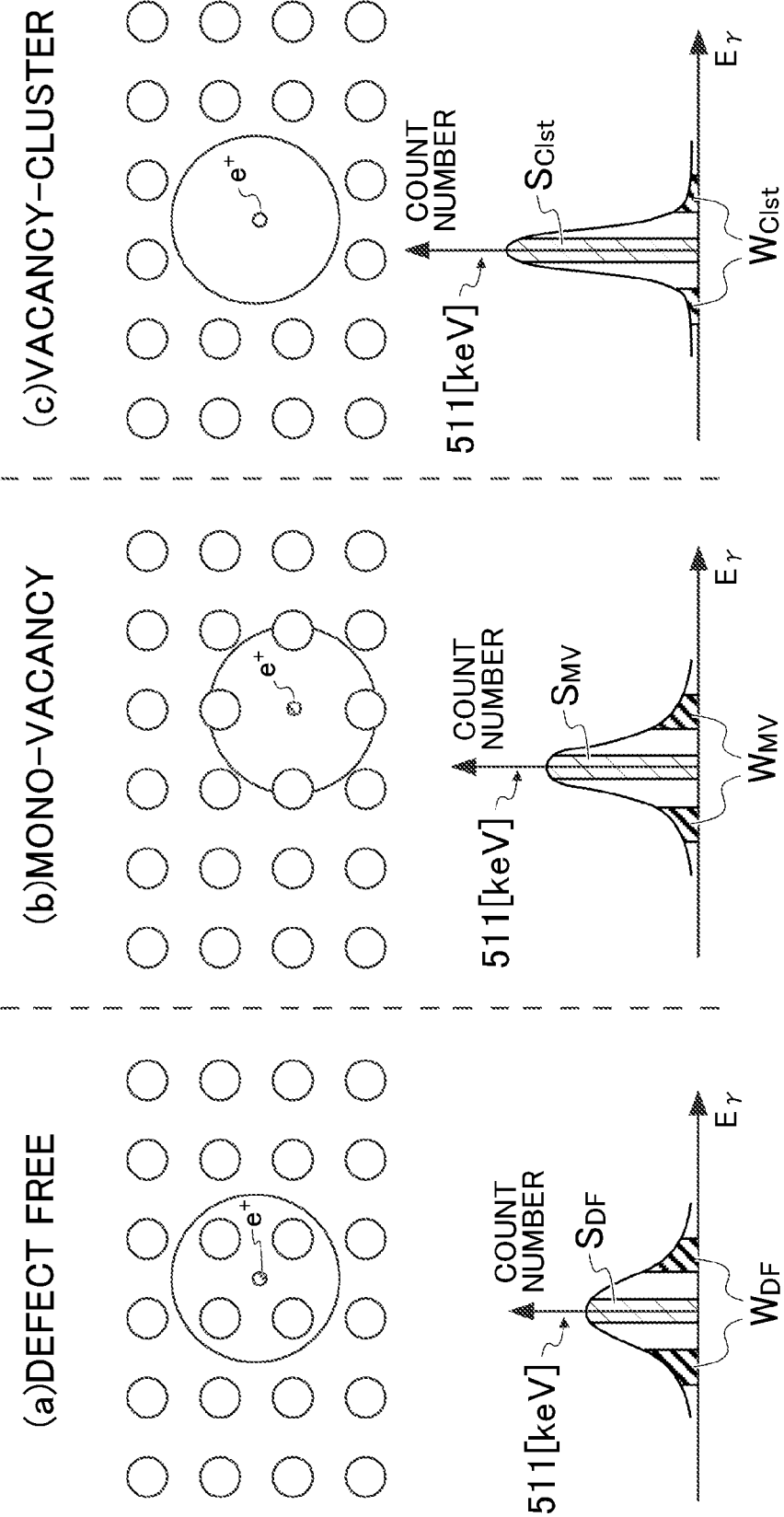
FIGS. 8 (a) to (c) are diagrams describing S-W parameters used in a positron annihilation method.

FIGS. 8 (a) to (c) are diagrams describing S-W parameters used in a positron annihilation method. Note that a positron is a counterpart substance of an electron. The positron has the same mass ($m_0$) as the electron and has a charge opposite to the electron. In FIG. 8, the positron is simply shown by $e^+$.

(a) is a diagram illustrating a case in which the positron exists in a region free from defects in the crystal (Defect Free). As shown on the upper side of (a), the positron receives a repulsive force from the atom core and exists at an interstitial position. The positron and the electron annihilate each other and mainly two photons are released in the opposite directions. One photon has an energy $m_0c^2$ (511 keV), where c is the velocity of light. The light of 511 keV corresponds to a gamma ray.

Resulting from the conservation of momentum before and after the pair annihilation, energies of $\pm\Delta E\gamma$ are released around 511 kev. Therefore, as shown on a lower side of (a), when plotted with a horizontal axis indicating $E\gamma$ [keV] and a vertical axis indicating a count number of photons, measured values represent an upwardly convex curve which is bilaterally symmetric around 511 keV.

In the present example, a value which is a count number of photons entering into a window having a predetermined energy width around 511 keV divided by a count number of all photons is defined as an S (Shape) parameter. Also, in a base portion of the upwardly convex curve which is apart from 511 keV by a predetermined energy, a value which is a count number of photons entering into a window having a predetermined energy width around 511 keV divided by a count number of all photons is defined as a W (Wing) parameter. Note that each window width and window position for the S parameter and W parameter are assumed common among (a) to (c).

(b) is a diagram illustrating a case in which the positron exists in a mono-vacancy defect. (c) is a diagram illustrating a case in which the positron exists in a region of clustering of a plurality of vacancy defects. The count number in the vicinity of 511 keV mainly means a frequency of pair annihilations of the positron and the valence electron. In contrast, the count number in the base portion of the upwardly convex curve mainly means a frequency of pair annihilations of the positron and the core electron. Note that the valence electron has a momentum distribution relatively narrower than the core electron.

In general, the larger the size of the vacancy defect is, the more probably the positron annihilates the valence electron having a narrower momentum distribution, and thus the sharper peak the upwardly convex curve has. That is, among the S parameters, there is a relationship of $S_{DF}<S_{MV}<S_{C1st}$, where the $S_{DF}$, $S_{MV}$, and $S_{C1st}$ are values of the S parameters for (a), (b) and (c), respectively.

In contrast, the smaller the size of the vacancy defect is, the more probably the positron annihilates the core electron having a broader momentum distribution, thereby increasing the count number in the base portion. That is, among the W parameters, there is a relationship of $W_{DF}>W_{MV}>W_{C1st}$, where the $W_{DF}$, $W_{MV}$, and $W_{C1st}$ are values of the W parameters for (a), (b) and (c), respectively. The S parameter and W parameter work as indices of the size of the vacancy defect.

Figure 9A:
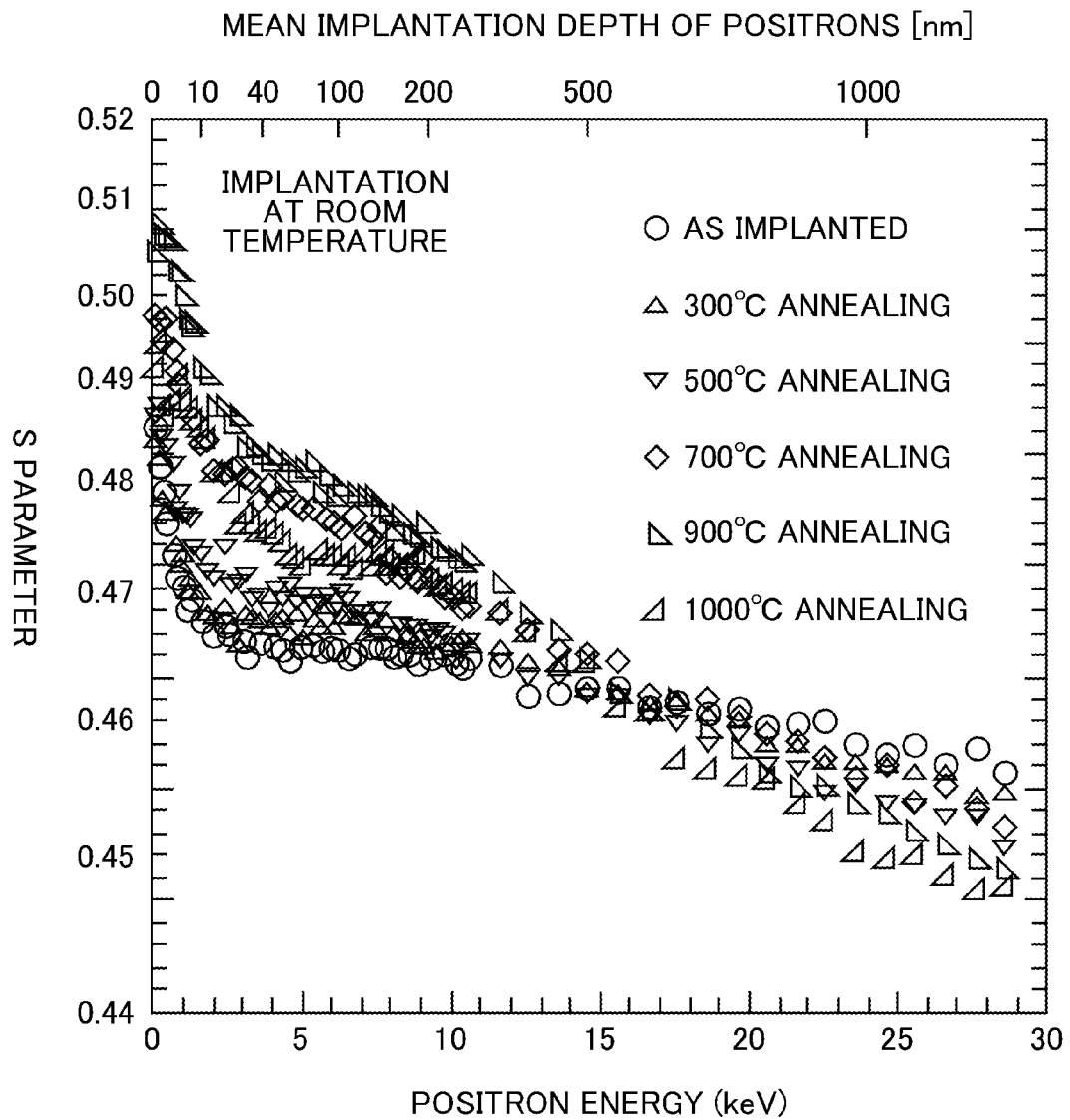
FIG. 9A is a positron implantation energy dependency of the S parameter in the experimental example 1.

FIG. 9A is a positron implantation energy dependency of the S parameter in the experimental example 1. The horizontal axis indicates an implantation energy [keV] of the positron (on the lower side) and a mean implantation depth of the positron which corresponds to the implantation energy of the positron [nm] (on the upper side), and the vertical axis indicates the S parameter. FIG. 9A shows the S parameter immediately after the impurity implantation and the S parameters when annealed at the annealing temperatures of 300 degrees C., 500 degrees C., 700 degrees C., 900 degrees C. and 1000 degrees C. For the processed stacked structures 460 annealed at not higher than 1000 degrees C., the S parameters were increased in the p-type region 424 (200 nm or less on an upper side of the horizontal axis).

Figure 9B:
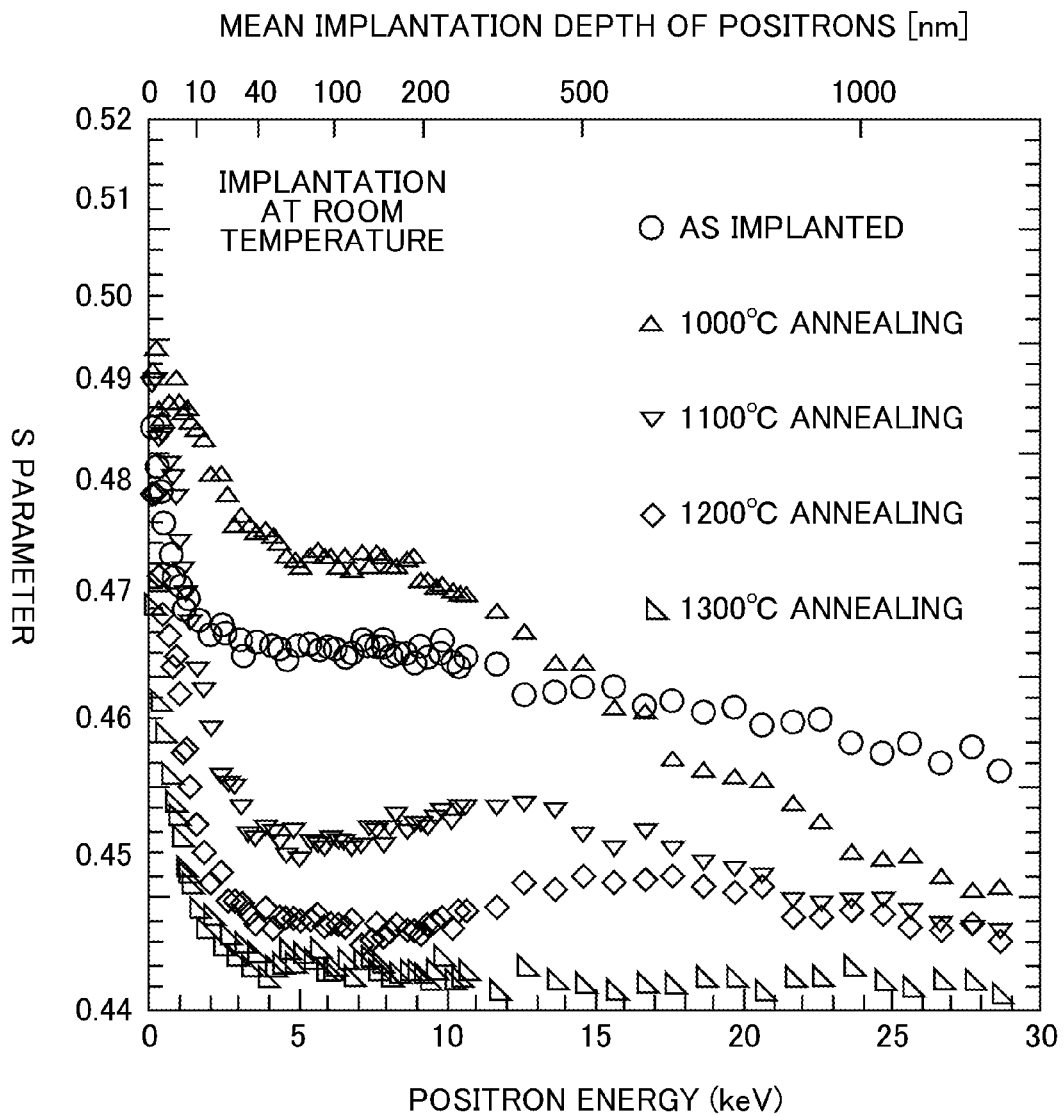
FIG. 9B is a positron implantation energy dependency of an S parameter in the experimental example 1.

FIG. 9B is also a positron implantation energy dependency of an S parameter in the experimental example 1. FIG. 9B shows the S parameter immediately after the impurity implantation and the S parameters annealed at the annealing temperatures of 1000 degrees C., 1100 degrees C., 1200 degrees C. and 1300 degrees C. For the processed stacked structures 460 annealed at 1100 degrees C., 1200 degrees C. and 1300 degrees C., except in regions of high S parameters due to the positron annihilation on a surface, a movement was seen in which the S parameters were decreased in the p-type region 424 at depths from 40 nm to 200 nm.

Figure 10:
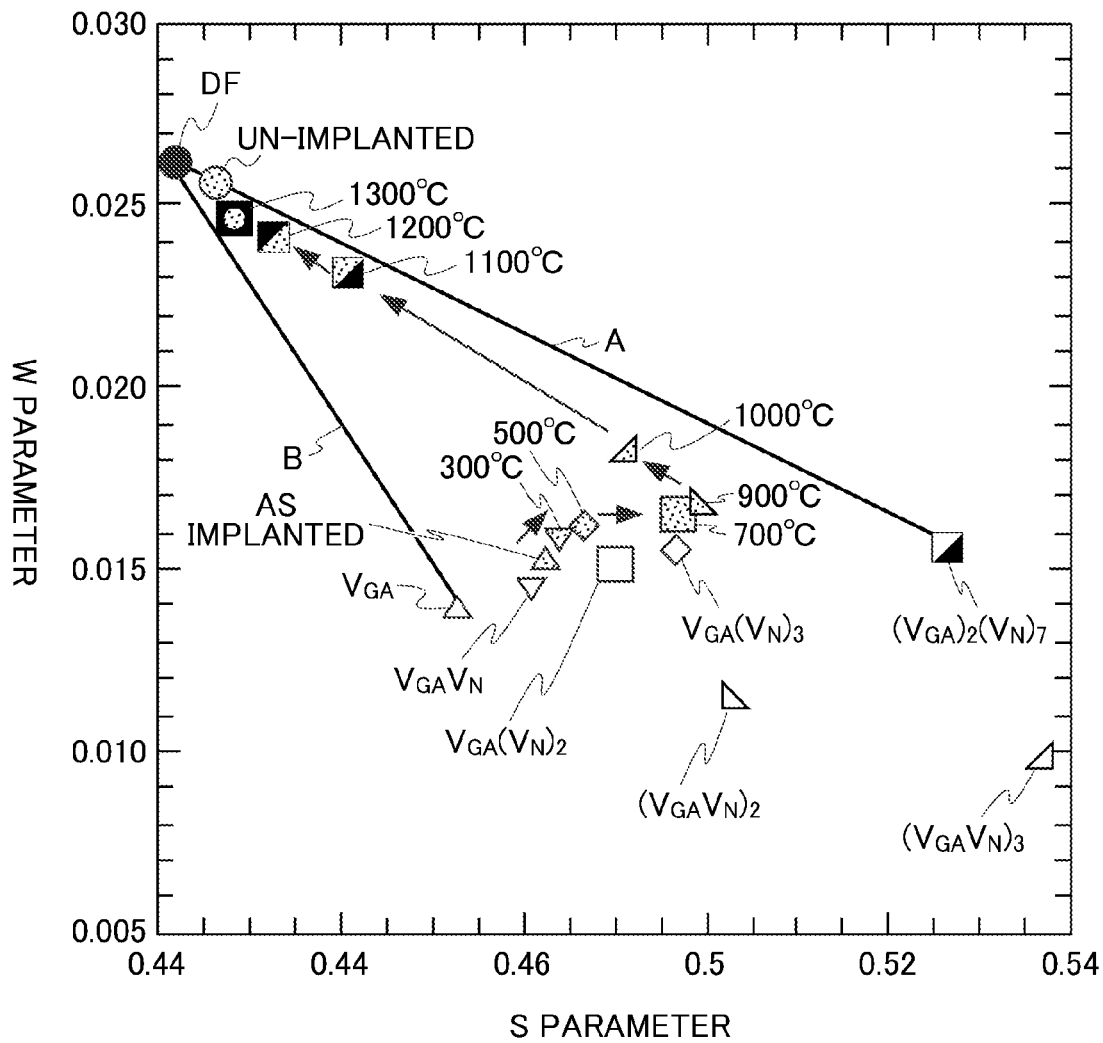
FIG. 10 is a diagram illustrating correspondence between types of defects and annealing temperatures in the experimental example 1.

FIG. 10 is a diagram illustrating correspondence between types of defects and annealing temperatures in the experimental example 1. The horizontal axis indicates the S parameter and the vertical axis indicates the W parameter. $V_{Ga}$ means a gallium (Ga) vacancy in GaN. Also, $V_N$ means a nitrogen (N) vacancy in GaN. $V_{Ga}V_N$ means a combined defect of one $V_{Ga}$ and one $V_N$. $V_{Ga}(V_N)_2$ means a combined defect of one $V_{Ga}$ and two $V_N$.

In FIG. 10, the S-W parameters of the defect shown by using V are calculated by the first-principles calculation. For example, FIG. 10 shows that, if the measured S-W value is at a position shown by $V_{Ga}$, a large amount (up to $10^{19}$ cm$^{-3}$) of $V_{Ga}$ exist in the measured crystal, and the positron annihilation occurs almost at the $V_{Ga}$ position. Also, FIG. 10 shows that, if the S-W value is between the vacancy defect and the DF (Defect Free), as can be seen on a straight line A or on a straight line B, both of the positron which annihilates electron at the position of the vacancy defect and the positron which annihilates the electron at the defect-free interstitial position are observed. That is, if the crystal is closer to the DF, the vacancy defect density in GaN is lower, and the observed number of S is decreased and that of W is increased. Accordingly, if the S-W value is observed at a position coming closer to the DF from $(V_{Ga})_2(V_N)_7$, for example, on the straight line A, it shows that $(V_{Ga})_2(V_N)_7$ exists in the crystal and the positron annihilation occurs at the position of the vacancy defect, but the defect density is low. The closer to the DF the vacancy defect is, the lower the density thereof is ($<10^{15}$ cm$^{-3}$). For example, it means that, even if a measured point exists on the straight line B, the closer to the DF the measured S-W value is, the lower the $V_{Ga}$ vacancy defect density in GaN is. In this manner, the relationship of the S-W parameters allows for evaluation of the type and density of the vacancy defect.

The S-W parameters immediately after the impurity implantation (As implanted), when annealed at the annealing temperatures of 300 degrees C., 500 degrees C., 700 degrees C., 900 degrees C., 1000 degrees C., 1100 degrees C., 1200 degrees C. and 1300 degrees C., and without the impurity implantation (Un-implanted) are actual measured values measured by the positron annihilation method. Note that the S-W parameters are values measured with the positron of 5 keV.

In the present example, the defect immediately after the impurity implantation became $V_{Ga}V_N$ (that is, di-vacancy). That is, at the impurity implantation before the step of the thermal process, a representative combined defect in the p-type region 424 in the GaN layer 412 was smaller than a combined defect $V_{Ga}(V_N)_2$ of one $V_{Ga}$ and two $V_N$. Note that it is supposed that each $V_{Ga}$ and $V_N$ have approximately the same size. In the present example, the representative combined defect means a defect type of the combined defect which corresponds to the S-W parameter value observed as a mean value of the S-W parameters of a target to be measured (p-type region 424). The correspondence relationship between the S-W parameter value and each defect type is as shown in FIG. 10.

The S parameter of the p-type region 424 annealed at 300 degrees C. to 1000 degrees C. is increased compared to that of the p-type region 424 immediately after the impurity implantation (that is, the defect is clustering). However, as shown by the annealing temperatures of 1100 degrees C., 1200 degrees C. and 1300 degrees C., if the annealing temperature was higher, the S parameter of the p-type region 424 was more decreased. That is, the size and defect density of the clustering defect could be reduced. At the annealing temperature of 1300 degrees C., it was in the state closest to the one before the impurity implantation (Unimplanted).

Figure 11:
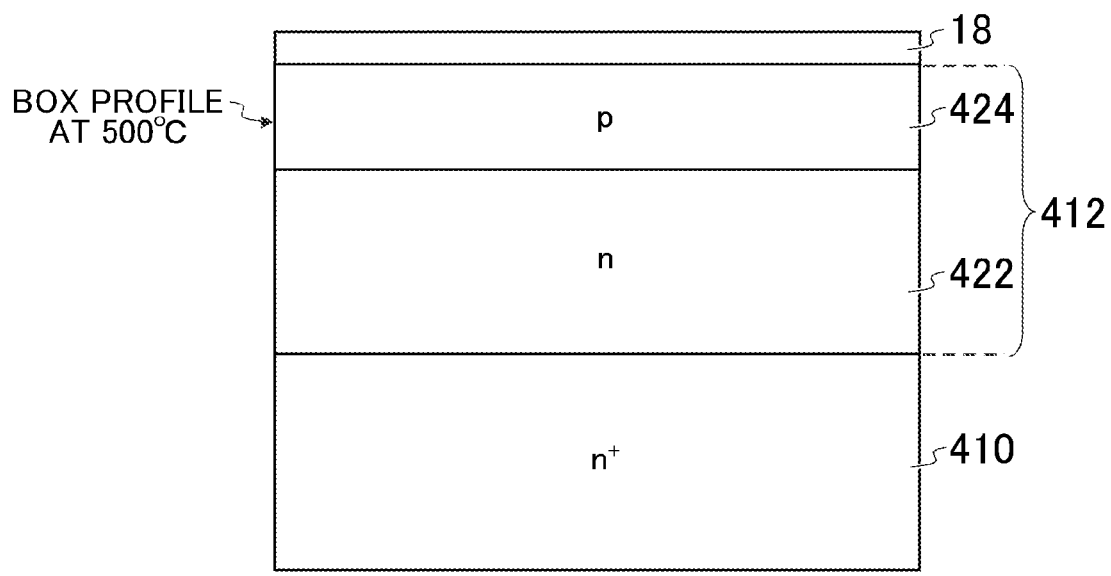
FIG. 11 is a schematic diagram illustrating a processed stacked structure 470 in the comparative example 1.

FIG. 11 is a schematic diagram illustrating a processed stacked structure 470 in the comparative example 1. In the comparative example 1, the GaN layer 412 was heated at the impurity implantation. That is, the temperature of the GaN layer 412 at the impurity implantation was set to 500 degrees C. In this respect, it is different from the experimental example 1. However, other conditions were set the same as those of the experimental example 1.

Figure 12:
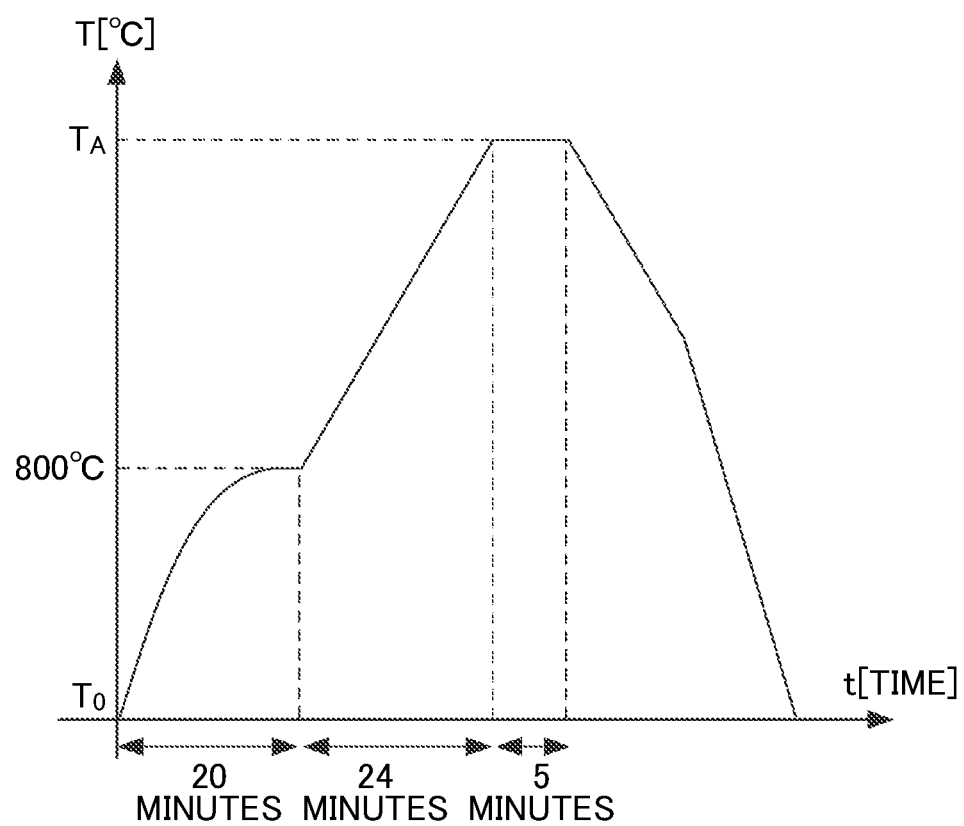
FIG. 12 is a diagram illustrating annealing in the comparative example 1.

FIG. 12 is a diagram illustrating annealing in the comparative example 1. In the comparative example 1, variations over time of the annealing temperature are different from those of the experimental example 1. However, the experimental example 1 and the comparative example 1 are the same in that the target temperature $T_A$ was set to 1000 degrees C., 1100 degrees C., 1200 degrees C. and 1300 degrees C.

In the comparative example 1, four processed stacked structures 470 were prepared. First, in order to stabilize the temperature in the annealing furnace 220, it took 20 minutes to increase the temperatures of four processed stacked structures 470 from the room temperature to 800 degrees C. altogether in the annealing furnace 220. Then, after the temperatures were increased to a predetermined temperature of approximately 20 degrees C./min, they were annealed for five minutes at the predetermined temperatures. The predetermined temperatures were set to 1000 degrees C., 1100 degrees C., 1200 degrees C. and 1300 degrees C., respectively. Then, the protective film 18 was removed from each processed stacked structure 470 and the defect in each processed stacked structure 470 was analyzed by the positron annihilation method. Note that, similar to the experimental example 1, the GaN layer 412 implanted with impurities but not annealed (indicated as "As implanted") and the GaN layer 412 without impurities implanted nor annealed (indicated as "Un-implanted") were prepared.

Figure 13:
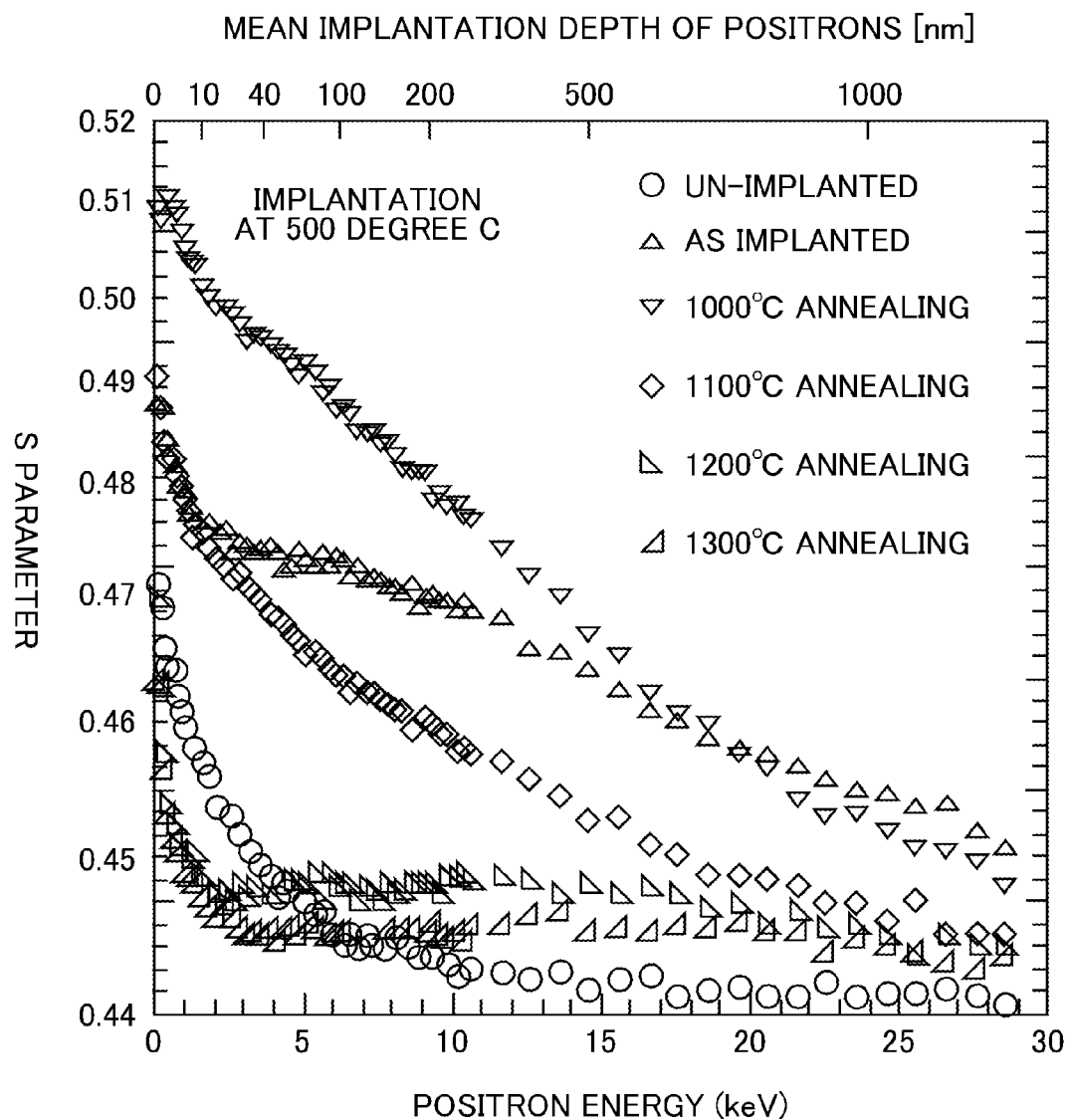
FIG. 13 is a positron implantation energy dependency of an S parameter in the comparative example 1.

FIG. 13 is a positron implantation energy dependency of an S parameter in the comparative example 1. The horizontal axis indicates an implantation energy [keV] of the positron (on the lower side) and a mean implantation depth of the positron which corresponds to the implantation energy of the positron [nm] (on the upper side), and the vertical axis indicates the S parameter. FIG. 13 shows the S parameter without the impurity implantation (Un-implanted), the S parameter immediately after the impurity implantation, and the S parameters when annealed at the annealing temperatures of 1000 degrees C., 1100 degrees C., 1200 degrees C. and 1300 degrees C. Compared to the one without the impurity implantation, the S parameters immediately after the impurity implantation and when annealed at the annealing temperature of 1000 degrees C. were increased. However, the S parameters when annealed at the annealing temperature of 1100 degrees C., 1200 degrees C. and 1300 degrees C. were gradually decreased. At shallow positions at depth of 40 nm or less, the S parameters when annealed at 1300 degrees C. were smaller than those without the impurity implantation.

Figure 14:
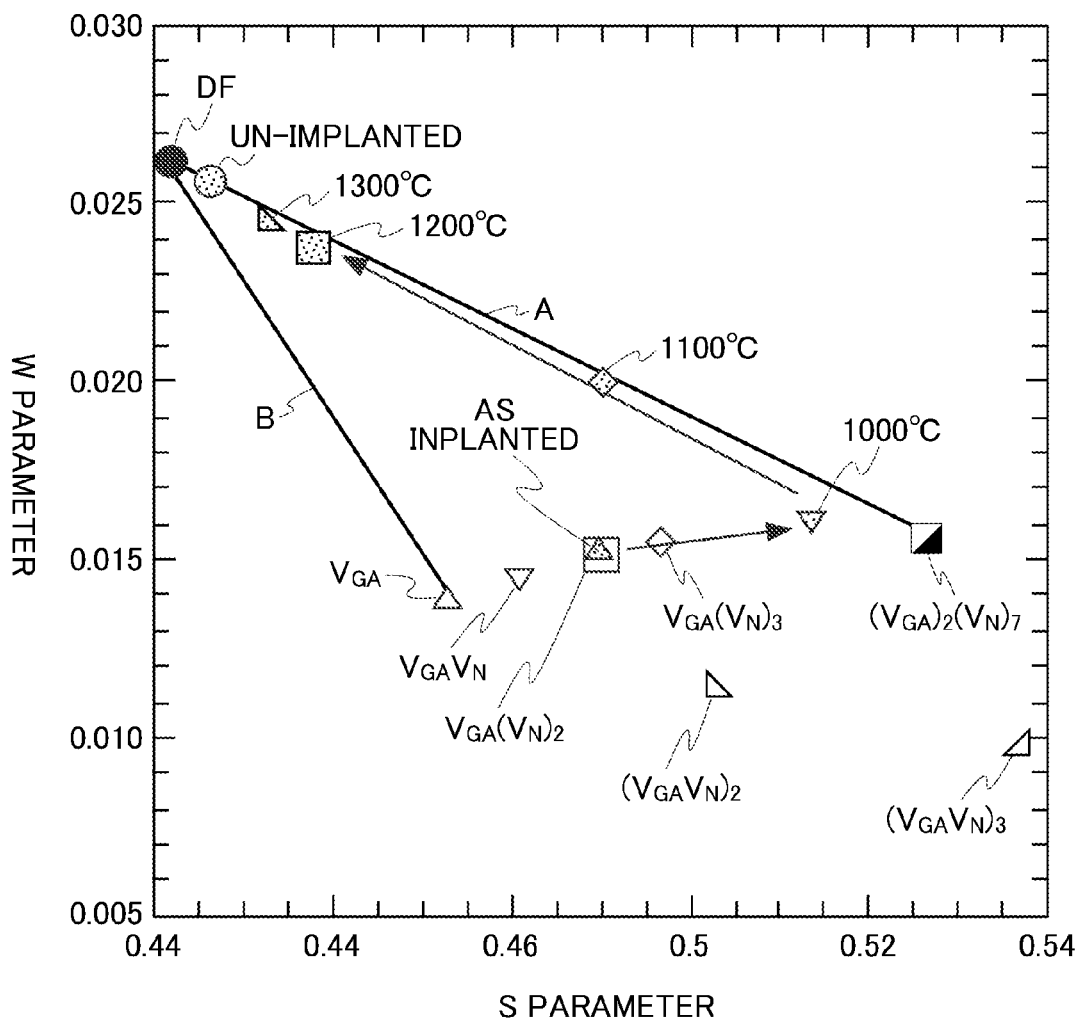
FIG. 14 is a diagram illustrating correspondence of types of defects and annealing temperatures in the comparative example 1.

FIG. 14 is a diagram illustrating correspondence of types of defects and annealing temperatures in the comparative example 1. Plots other than those immediately after the impurity implantation (As implanted) and when annealed at 300 degrees C. to 1300 degrees C. are the same as those of the experimental example 1 in FIG. 10. Note that the S-W parameters immediately after the impurity implantation are values measured with the positron of 5 keV. The S-W parameters annealed at the annealing temperatures of 1000 degrees C. and 1100 degrees C. are values measured with the positron of 3 keV. The S-W parameters annealed at the annealing temperatures of 1200 degrees C. and 1300 degrees C. are values measured with the positron of 10 keV.

In the present example in which the temperature of the GaN layer 412 at the impurity implantation was set to 500 degrees C., the defect of $V_{Ga}(V_N)_2$ occurred immediately after the impurity implantation. Also, in case of the annealing temperature of 1000 degrees C., the defect of a class of $(V_{Ga})_2(V_N)_7$ occurred. In case of the annealing temperatures of 1100 degrees C., 1200 degrees C. and 1300 degrees C., a gradual approach to the DF was shown such that the defect of the class of $(V_{Ga})_2(V_N)_7$ was decreased.

Comparing the comparative example 1 and the experimental example 1, in the experimental example 1 in which the temperature of the GaN layer 412 is set to the room temperature at the impurity implantation and increased at approximately 20 degrees C./min within the predetermined temperature region, the S parameters immediately after the implantation and when annealed at each annealing temperature not lower than 1000 degrees C. are smaller. That is, in the experimental example 1, an increase in size of the defect generated in the p-type region 424 was more suppressed and the defect reduction was more effectively achieved.

Figure 15:
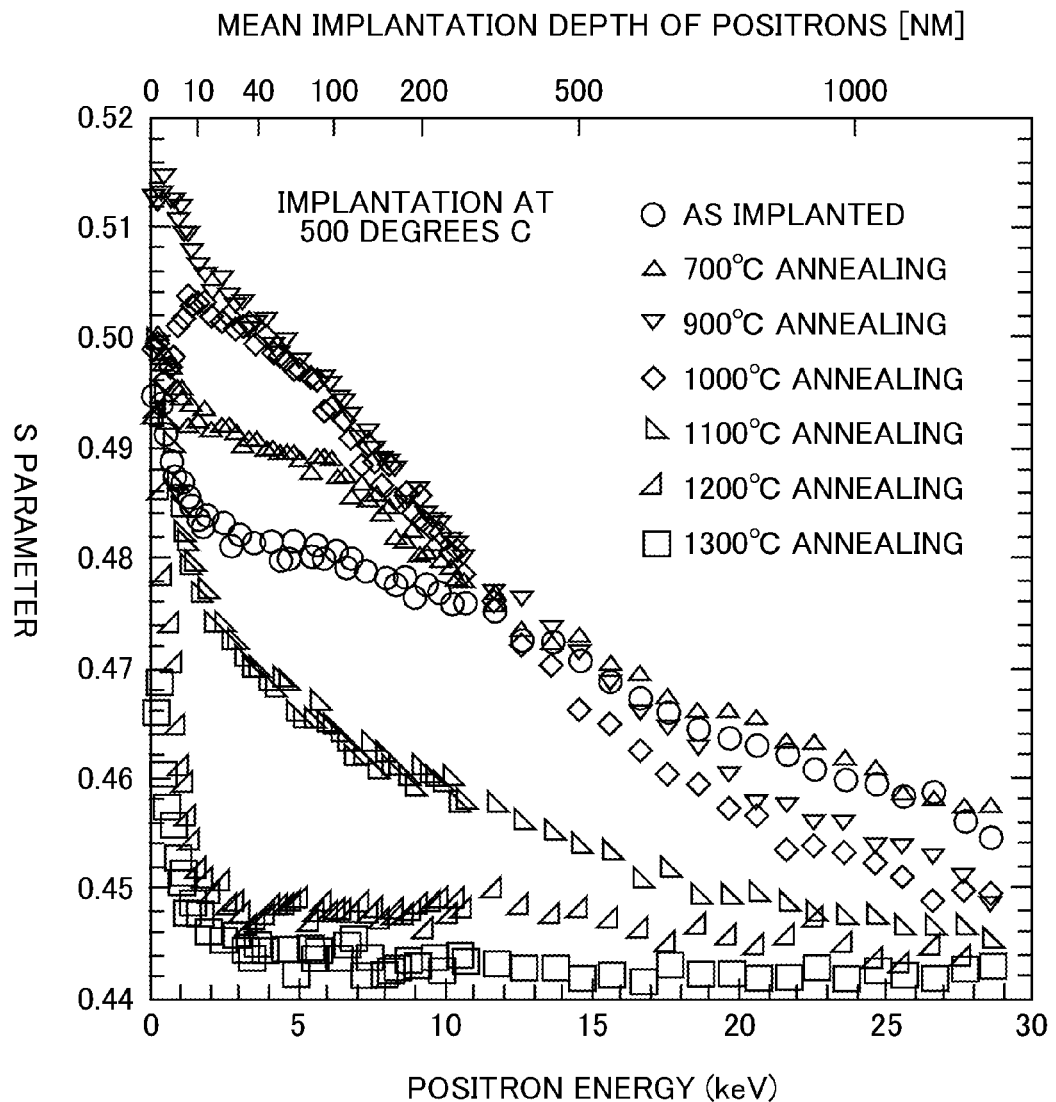
FIG. 15 is a positron implantation energy dependency of an S parameter in the comparative example 2.

FIG. 15 is a positron implantation energy dependency of an S parameter in the comparative example 2. The horizontal axis and vertical axis are the same as in FIG. 13. In the comparative example 2, the temperature of the GaN layer 412 at the impurity implantation was set to the same 500 degrees C. In this respect, it is the same as the comparative example 1. Also, in the comparative example 2, annealing was performed through the same process of the temperature as in FIG. 7 of the experimental example 1. The S parameters when annealed at 700 degrees C., 900 degrees C. and 1000 degrees C. were increased more gradually with respect to those immediately after the impurity implantation. However, the S parameters when annealed at 1100 degrees C., 1200 degrees C. and 1300 degrees C. were decreased more gradually with respect to those immediately after the impurity implantation. The movements of the S parameters with respect to the annealing temperatures were the same as those in the experimental example 1.

Figure 16:
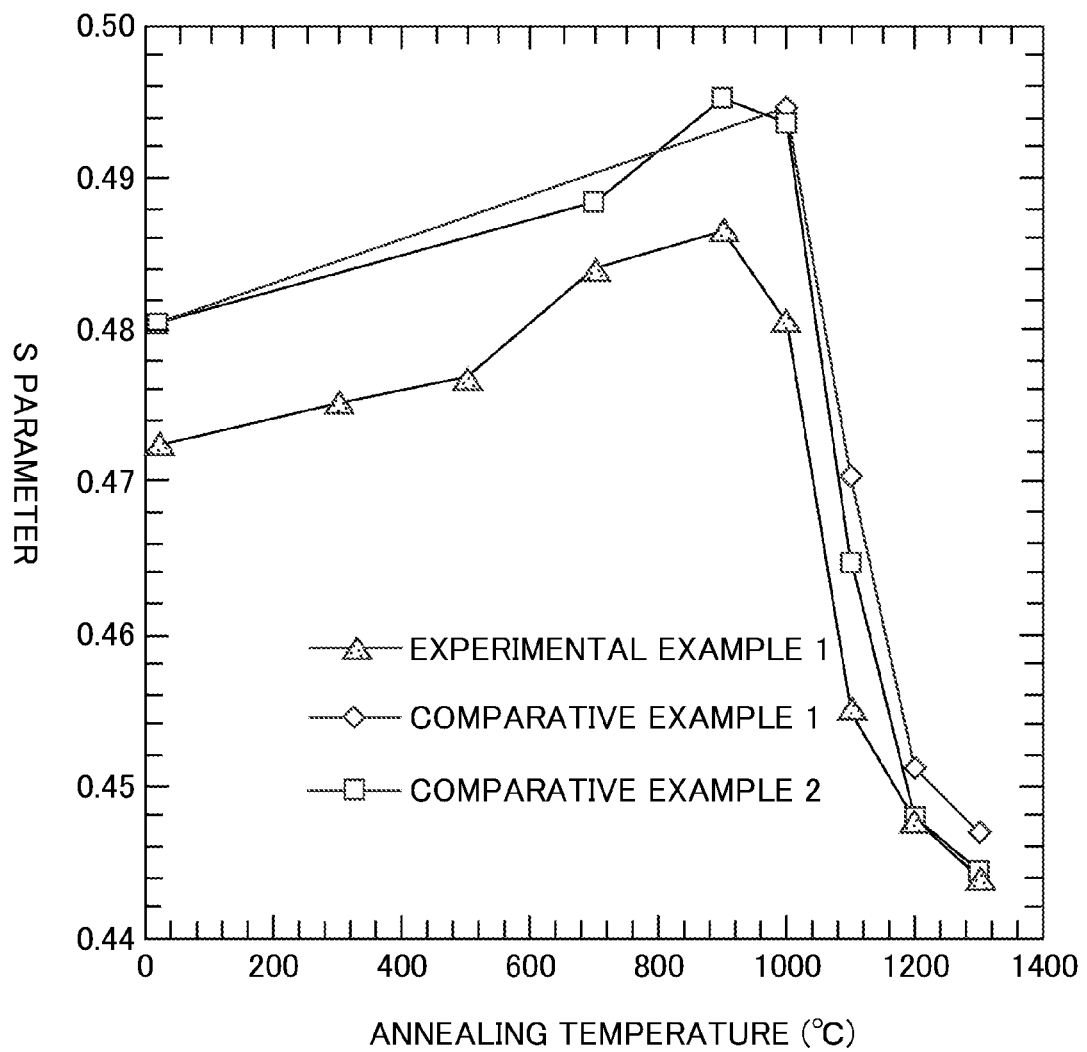
FIG. 16 is a diagram illustrating influences of the defect with respect to the annealing temperature in the experimental example 1, the comparative example 1, and the comparative example 2.

FIG. 16 is a diagram illustrating influences of the defect with respect to the annealing temperature in the experimental example 1, the comparative example 1, and the comparative example 2. The horizontal axis indicates the annealing temperature (degrees C.). The vertical axis indicates the S parameter measured with the positron of 6 keV (corresponding to a depth of approximately 100 nm). The S parameters (of apex-upward triangles) in the experimental example 1 became smaller than the S parameters (of diamond shapes) in the comparative example 1 and those (of squares) in the comparative example 2 in any case. Therefore, it can be argued that decreasing the temperature of the GaN layer 412 at the impurity implantation is effective to reduce the size and density of the combined defect.

From changes in temperature of the S parameters in the experimental example 1 and the S parameters in the comparative example 2, the movement of the S parameters was seen such that the increases were accelerated at 700 degrees C. and formed peaks at 900 degrees C. That is, it can be argued that the temperature region from 700 degrees C. to 900 degrees C. is a temperature region for increasing the S parameter, that is, accelerating clustering of the defect.

The S parameters in the experimental example 1 and comparative example 2 became smaller than the S parameters in the comparative example 1 at the annealing temperatures of not lower than 1100 degrees C. Rapidly increasing the temperature within a predetermined temperature region not higher than 1000 degrees C. suppressed clustering of the defect accelerated in the temperature region from 700 degrees C. to 900 degrees C., thereby achieving an effect to reduce the size and density of the combined defect.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: GaN substrate, 12: GaN layer, 14: front surface, 16: back surface, 18: protective film, 22: n-type region, 24: p-type well, 25: channel forming region, 26: p$^+$-type well, 28: n⁺-type well, 29: photoresist mask, 30: gate terminal, 32: gate insulating film, 34: gate electrode, 40: source terminal, 44: source electrode, 50: drain terminal, 54: drain electrode, 60: processed stacked structure, 100: MOSFET, 200: annealing apparatus, 210: control unit, 215: power supply unit, 220: annealing furnace, 230: shutter unit, 234: shutter, 238: driving unit, 240: elevation unit, 244: tray, 246: stage, 248: driving unit, 300: diode, 310: GaN substrate, 312: GaN layer, 314: front surface, 316: back surface, 322: n-type region, 324: p-type well, 330: insulating film, 340: anode electrode, 350: cathode electrode, 410: GaN substrate, 412: GaN layer, 422: n-type region, 424: p-type region, 460: processed stacked structure, 470: processed stacked structure

What is claimed is:

1. A manufacturing method of a semiconductor device including a nitride semiconductor layer comprising:
 implanting impurities in the nitride semiconductor layer; and
 increasing a temperature of the nitride semiconductor layer from an initial temperature to a target temperature and annealing the nitride semiconductor layer at the target temperature for a predetermined time period; wherein
 in the annealing, in at least part of temperature regions below a first temperature between the initial temperature and the target temperature, the nitride semiconductor layer is annealed at a temperature increase speed lower than in a temperature region not lower than the first temperature.

2. The manufacturing method of a semiconductor device according to claim 1, wherein the annealing includes:
 first annealing for annealing the nitride semiconductor layer for a predetermined time period in the at least part of temperature regions below the first temperature; and
 after the first annealing, second annealing for annealing the nitride semiconductor layer at the target temperature for a predetermined time period.

3. The manufacturing method of a semiconductor device according to claim 1, wherein the first temperature is not lower than 500 degrees C. and not higher than 900 degrees C.

4. The manufacturing method of a semiconductor device according to claim 1, wherein the annealing includes annealing the nitride semiconductor layer at a temperature lower than the first temperature for 10 minutes or more.

5. The manufacturing method of a semiconductor device according to claim 4, further comprising:
 after the implanting and before the annealing, forming a protective film on the nitride semiconductor layer.

6. The manufacturing method of a semiconductor device according to claim 1, wherein
 in the implanting, the impurities are implanted in the nitride semiconductor layer having a temperature not higher than 150 degrees C.

7. The manufacturing method of a semiconductor device according to claim 6, wherein
 in the implanting, the impurities are implanted in the nitride semiconductor layer having a room temperature.

8. The manufacturing method of a semiconductor device according to claim 1, wherein
 in the nitride semiconductor layer before the annealing, a representative combined defect is smaller than a combined defect $V_{Ga}(V_N)_2$ formed of one gallium vacancy and two nitrogen vacancies.

9. The manufacturing method of a semiconductor device according to claim 1, wherein the nitride semiconductor layer is a homoepitaxial layer provided on a nitride semiconductor substrate having a threading dislocation density of $10^7$ cm$^{-2}$ or less.

10. The manufacturing method of a semiconductor device according to claim 9, wherein the nitride semiconductor layer and the nitride semiconductor substrate contain gallium nitride.

11. The manufacturing method of a semiconductor device according to claim 1, wherein
 in the implanting, ion species of the impurities are one or more types from among magnesium, calcium, beryllium and zinc.

12. A manufacturing method of a semiconductor device including a nitride semiconductor layer comprising:
 implanting impurities in the nitride semiconductor layer; and
 increasing a temperature of the nitride semiconductor layer from an initial temperature to a target temperature and annealing the nitride semiconductor layer at the target temperature for a predetermined time period; wherein
 in the annealing, a temperature increase speed of the nitride semiconductor layer in a temperature region not lower than a first temperature and not higher than a second temperature is higher than the temperature increase speed of the nitride semiconductor layer in a temperature region lower than the first temperature and a temperature region higher than the second temperature, the first temperature being higher than the initial temperature, and the second temperature being higher than the first temperature and lower than the target temperature.

13. The manufacturing method of a semiconductor device according to claim 12, wherein
 at the first temperature in the annealing, the temperature increase speed of the nitride semiconductor layer is set higher than in a temperature region lower than the first temperature, and
 at the second temperature in the annealing, the temperature increase speed of the nitride semiconductor layer is set lower than in a temperature region not lower than the first temperature and not higher than the second temperature.

14. The manufacturing method of a semiconductor device according to claim 12, wherein the second temperature is not lower than 700 degrees C. and not higher than 1100 degrees C.

* * * * *